(12) United States Patent
Chen et al.

(10) Patent No.: US 11,316,036 B2
(45) Date of Patent: Apr. 26, 2022

(54) INSULATED GATE BIPOLAR TRANSISTOR STRUCTURE AND MANUFACTURING METHOD THEREOF

(71) Applicant: Powerchip Semiconductor Manufacturing Corporation, Hsinchu (TW)

(72) Inventors: Chun-Sheng Chen, Taipei (TW); Yen-Cheng Fang, Hualien County (TW); Zih-Han Chen, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/000,371

(22) Filed: Aug. 24, 2020

(65) Prior Publication Data

US 2021/0391451 A1    Dec. 16, 2021

(30) Foreign Application Priority Data

Jun. 16, 2020   (TW) ................................. 109120243

(51) Int. Cl.
| | |
|---|---|
| *H01L 29/739* | (2006.01) |
| *H01L 29/06* | (2006.01) |
| *H01L 29/66* | (2006.01) |
| *H01L 29/10* | (2006.01) |
| *H01L 29/40* | (2006.01) |
| *H01L 29/423* | (2006.01) |
| *H01L 29/08* | (2006.01) |

(52) U.S. Cl.
CPC ........ *H01L 29/7393* (2013.01); *H01L 29/063* (2013.01); *H01L 29/0653* (2013.01); *H01L 29/0847* (2013.01); *H01L 29/1095* (2013.01); *H01L 29/402* (2013.01); *H01L 29/4236* (2013.01); *H01L 29/66325* (2013.01)

(58) Field of Classification Search
CPC ............. H01L 29/0653; H01L 29/7393; H01L 29/66325
See application file for complete search history.

(56) References Cited

U.S. PATENT DOCUMENTS

| | | | |
|---|---|---|---|
| 8,405,248 B2* | 3/2013 | Mumtaz ................. | H02J 3/383 307/66 |
| 8,482,031 B2 | 7/2013 | Udrea et al. | |
| 8,735,937 B2* | 5/2014 | Sze ................... | H01L 29/66325 257/141 |
| 9,853,121 B2 | 12/2017 | Lin et al. | |
| | (Continued) | | |

OTHER PUBLICATIONS

"Office Action of Taiwan Counterpart Application", dated Dec. 3, 2020, p. 1-p. 3.

(Continued)

*Primary Examiner* — Bilkis Jahan
*Assistant Examiner* — Victor V Barzykin
(74) *Attorney, Agent, or Firm* — JCIPRNET

(57) ABSTRACT

An insulated gate bipolar transistor (IGBT) structure including a substrate and a first gated PNPN diode is provided. The first gated PNPN diode is located on the substrate. The first gated PNPN diode includes a first gate, a first source/drain extension (SDE) region, and a second SDE region. The first gate is located on the substrate. The first SDE region and the second SDE region are located in the substrate on two sides of the first gate.

20 Claims, 21 Drawing Sheets

(56) References Cited

U.S. PATENT DOCUMENTS

| | | | | |
|---|---|---|---|---|
| 11,063,141 | B1* | 7/2021 | Chen | H01L 29/0623 |
| 2008/0191277 | A1* | 8/2008 | Disney | H01L 29/1087 |
| | | | | 257/343 |
| 2010/0052049 | A1* | 3/2010 | Lotfi | H01L 21/28518 |
| | | | | 257/334 |
| 2010/0052051 | A1* | 3/2010 | Lotfi | H01L 21/761 |
| | | | | 257/334 |
| 2014/0117367 | A1* | 5/2014 | Blanchard | H01L 29/7803 |
| | | | | 257/66 |
| 2015/0097238 | A1* | 4/2015 | Zhang | H01L 29/1045 |
| | | | | 257/347 |
| 2017/0025442 | A1* | 1/2017 | Flachowsky | H01L 21/31051 |
| 2019/0363188 | A1* | 11/2019 | You | H01L 21/26513 |
| 2021/0234042 | A1* | 7/2021 | Xu | H01L 29/66681 |

OTHER PUBLICATIONS

Ying-Chieh Tsai, "Design and Application of a High voltage Lateral Insulated Gate Bipolar Transistor", Doctoral Dissertation of National Tsing Hua University, Jul. 2017, pp. 1-135.

T. Trajkovic, et al., "800V Lateral IGBT in Bulk Si for Low Power Compact SMPS Applications." Proceedings of The 25th International Symposium on Power Semiconductor Devices & ICS, May 2013, pp. 401-404.

Vasantha Pathirana, et al., "Low-Loss 800-V Lateral IGBT in Bulk Si Technology Using a Floating Electrode." IEEE Electron Device Letters, vol. 39, No. 6, Jun. 2018, pp. 866-868.

Ramakrishna Tadikonda, et al., "Analysis of lateral IGBT with a variation in lateral doping drift region in junction isolation technology," IEEE Transactions on Electron Devices, vol. 53, No. 7, Jul. 2006, pp. 1740-1744.

Don Disney, et al., "High-Voltage Integrated Circuits: History,State of the Art, and Future Prospects." IEEE Transactions on Electron Devices, vol. 64, No. 3, Mar. 2017, pp. 1-15.

Simon M. Sze, et al., "Physics of Semiconductor Devices, 3rd Edition." Wiley-lnterscience, Oct. 2006, pp. 582-586.

Hans Jurgen Mattausch, "HiSIM Compact Model Framework and Recent Developments for SOI Devices with Ultrathin Si and BOX Layers." Arbeitskreis MOS-Modelle und Parameterextraktion MOS Modeling and Parameter Extraction Working Group, Sep. 2013, pp. 1-47.

P.A. Gough, et al., "Fast Switching Lateral Insulated Gate Transistor." 1986 International Electron Devices Meeting, Dec. 1986, pp. 218-221.

Johnny K. O. Sin, et al., "Lateral Insulated-Gate Bipolar Transistor (LIGBT) with a Segmented Anode Structure." IEEE Electron Device Letters, vol. 12, No. 2, Feb. 1991, pp. 45-47.

Jung-Hoon Chun, et al., "A Fast-Switching SOI SA-LIGBT without NDR region." 12th International Symposium on Power Semiconductor Devices & ICs, May 2000, pp. 149-152.

\* cited by examiner

INSULATED GATE BIPOLAR TRANSISTOR STRUCTURE AND MANUFACTURING METHOD THEREOF

CROSS-REFERENCE TO RELATED APPLICATION

This application claims the priority benefit of Taiwan application no. 109120243, filed on Jun. 16, 2020. The entirety of the above-mentioned patent application is hereby incorporated by reference herein and made a part of this specification.

BACKGROUND OF THE INVENTION

Field of the Invention

The invention relates to a semiconductor device and a manufacturing method thereof, and particularly relates to an insulated gate bipolar transistor (IGBT) structure and a manufacturing method thereof.

Description of Related Art

Currently, the IGBT is the power transistor commonly used in the industry, which combines the insulated gate structure of the metal oxide semiconductor field effect transistor (MOSFET) and the conduction characteristics of the bipolar junction transistor (BJT), so the IGBT has the dual advantages of high output current and high input impedance.

However, since the current process of the IGBT cannot be integrated with the process of the MOS device, the process complexity is greatly increased.

SUMMARY OF THE INVENTION

The invention provides an IGBT structure and a manufacturing method thereof, which can be integrated with the MOS device process, thereby reducing the process complexity.

The invention provides an IGBT structure, which includes a substrate and a first gated PNPN diode. The first gated PNPN diode is located on the substrate. The first gated PNPN diode includes a first gate, a first source/drain extension (SDE) region, and a second SDE region. The first gate is located on the substrate. The first SDE region and the second SDE region are located in the substrate on two sides of the first gate.

According to an embodiment of the invention, in the IGBT structure, the first gated PNPN diode may further include a first dielectric layer, a first spacer, and a second spacer. The first dielectric layer is located between the first gate and the substrate. The first spacer and the second spacer are located on two sidewalls of the first gate. The first SDE region and the second SDE region may be respectively located below the first spacer and the second spacer.

According to an embodiment of the invention, in the IGBT structure, the first gated PNPN diode may further include a first region, a second region, a third region, and a fourth region. The first region, second region, third region, and fourth region are located in the substrate. The first region and the third region may be a first conductive type. The second region, the fourth region, the first SDE region, and the second SDE region may be a second conductive type. There may be PN junctions between the first region and the second region, between the second region and the third region, and between the third region and the fourth region, respectively.

According to an embodiment of the invention, in the IGBT structure, the PN junction between the second region and the third region may be located directly under the first gate or located on one side of the first gate.

According to an embodiment of the invention, in the IGBT structure, the first region may include a first doped region. The second region may include a first well region. The third region may include second well region and second doped region. The fourth region may include a third doped region. The first doped region is located in the first well region. The second doped region and the third doped region are located in the second well region. The second doped region and the third doped region may be short-circuited.

According to an embodiment of the invention, in the IGBT structure, the second region may further include a fourth doped region. The fourth doped region is located in the first well region. The first well region may cover the first doped region and the fourth doped region.

According to an embodiment of the invention, in the IGBT structure, the fourth doped region may be further located in the second well region.

According to an embodiment of the invention, the IGBT structure may further include an isolation structure. The isolation structure is located in the substrate between the first doped region and the fourth doped region.

According to an embodiment of the invention, in the IGBT structure, the first gated PNPN diode may further include a second gate, a third SDE region, a fourth SDE region, and fifth doped region. The second gate is located on the substrate. The first gate and the second gate are spaced apart above the second well region. The third SDE region and the fourth SDE region are located in the substrate on two sides of the second gate. The third SDE region and the fourth SDE region may be the second conductive type. The fifth doped region is located in the second well region between the first gate and the second gate. The fifth doped region may be the second conductive type.

According to an embodiment of the invention, in the IGBT structure, the first gated PNPN diode may further include a second dielectric layer, a third spacer, and a fourth spacer. The second dielectric layer is located between the second gate and the substrate. The third spacer and fourth spacer are located on two sidewalls of the second gate. The third SDE region and fourth SDE region may be respectively located below the third spacer and the fourth spacer.

According to an embodiment of the invention, the IGBT structure may further include a self-aligned silicide (salicide) block (SAB) layer. The SAB layer is located on the substrate between the first doped region and the first gate.

According to an embodiment of the invention, in the IGBT structure, the height of the bottom surface of the first well region may be equal to or lower than the height of the bottom surface of the second well region.

According to an embodiment of the invention, in the IGBT structure, the second region may further include a third well region. The third well region covers the first well region.

According to an embodiment of the invention, in the IGBT structure, the third well region may further cover the second well region.

According to an embodiment of the invention, the IGBT structure may further include a second gated PNPN diodes. The second gated PNPN diode is located on the substrate.

The first gated PNPN diode and the second gated PNPN diode may be mirror-symmetric and may share the first gate.

According to an embodiment of the invention, in the IGBT structure, the second region may further include a fourth well region. The fourth well region is located between the second well region of the first gated PNPN diode and the second well region of the second gated PNPN diode. The fourth well region is connected to the third well region.

According to an embodiment of the invention, in the IGBT structure, the second region may further include a third well region. The third well region may partially cover the first well region and may completely cover the second well region.

According to an embodiment of the invention, the IGBT structure may further include a third well region. The third well region is located in the substrate. The third well region may be the first conductive type. The third well region covers the first well region.

According to an embodiment of the invention, in the IGBT structure, the width of the portion of the first gate located above the first well region may be greater than the width of the portion of the first gate located above the second well region.

According to an embodiment of the invention, in the IGBT structure, the first gate may have a flat lower surface.

According to an embodiment of the invention, in the IGBT structure, the substrate may be the first conductive type. The first region may include the first doped region. The second region may include the first well region. The third region may include the substrate and a second doped region. The fourth region may include a third doped region. The first doped region is located in the first well region. The second doped region and the third doped region are located in the substrate. The second doped region and the third doped region may be short-circuited.

According to an embodiment of the invention, in the IGBT structure, the first gate may be a planar gate or a recessed gate.

The invention provides a method for manufacturing an IGBT structure, which includes using a manufacturing method of a metal oxide semiconductor device to manufacture an IGBT structure.

Based on the above description, in the IGBT structure and the manufacturing method thereof according to the invention, the first gated PNPN diode includes the first gate, the first SDE region, and the second SDE region, and the first SDE region and the second SDE region are located in the substrate on two sides of the first gate. Since the IGBT structure can be manufactured by using the manufacturing method of the MOS device, the manufacturing process of the IGBT structure can be integrated with the manufacturing process of the MOS (or the complementary metal oxide semiconductor (CMOS)) device, so that the process complexity can be reduced.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
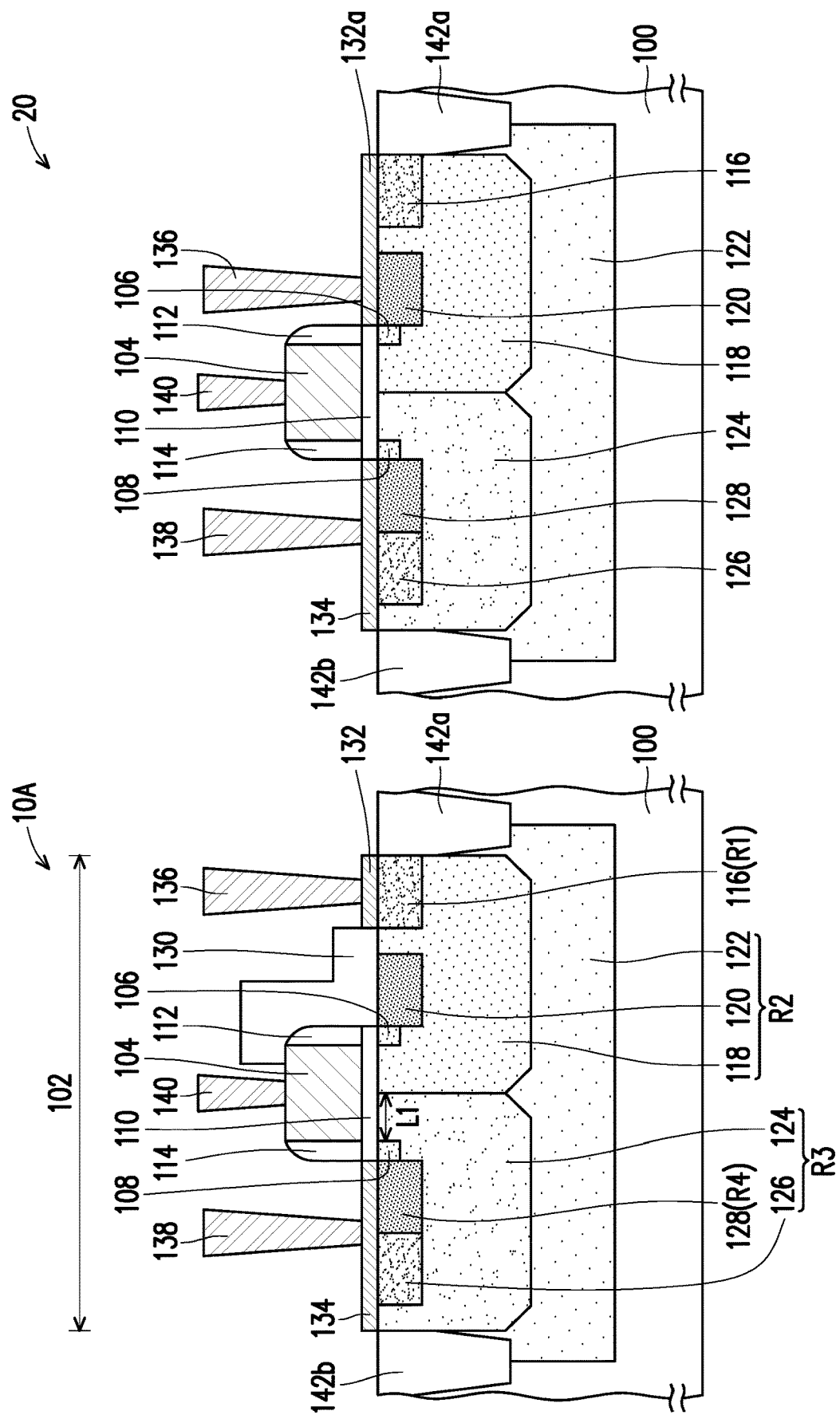
FIG. 1 is a cross-sectional view illustrating an IGBT structure and a MOS device according to an embodiment of the invention.

FIG. 1 is a cross-sectional view illustrating an IGBT structure and a MOS device according to an embodiment of the invention.

Referring to FIG. 1, an IGBT structure 10A includes a substrate 100 and a gated PNPN diode 102. The IGBT structure 10A may be a lateral IGBT (LIGBT). The substrate 100 may be a semiconductor substrate such as a silicon substrate. The substrate 100 may be a first conductive type or a second conductive type.

Hereinafter, the first conductive type and the second conductive type may be one and the other of the P-type conductive type and the N-type conductive type, respectively. In the present embodiment, the first conductive type is, for example, the P-type conductive type, and the second conductive type is, for example, the N-type conductive type, but the invention is not limited thereto. In other embodiments, the first conductive type may be the N-type conductive type, and the second conductive type may be the P-type conductive type.

In the present embodiment, the substrate 100 is, for example, the first conductive type (e.g., P-type), but the invention is not limited thereto. In other embodiments, the substrate 100 may be the second conductive type (e.g., N-type), but the invention is not limited thereto.

The gated PNPN diode 102 is located on the substrate 100. The gated PNPN diode 102 includes a gate 104, a SDE region 106, and a SDE region 108. The gate 104 is located on the substrate 100. The gate 104 may be a planar gate or a recessed gate. In the present embodiment, the gate 104 is, for example, the planar gate, but the invention is not limited thereto. The gate 104 may have a flat lower surface. The material of the gate 104 is, for example, doped polysilicon.

The SDE region 106 and the SDE region 108 are located in the substrate 100 on two sides of the gate 104. The SDE region 106 and the SDE region 108 may be the lightly doped drain (LDD) or the double diffused drain (DDD). The SDE region 106 and the SDE region 108 may be the second conductive type (e.g., N-type). In FIG. 1, only the main portions of the SDE region 106 and the SDE region 108 are shown, but the invention is not limited thereto. As long as the SDE region 106 and the SDE region 108 are not covered by the subsequently formed doped region, the SDE region 106 and the SDE region 108 may also be located at other locations of the substrate 100.

In addition, the gated PNPN diode 102 may further include at least one of a dielectric layer 110, a spacer 112, a spacer 114, a first region R1, a second region R2, a third region R3, and a fourth region R4. The dielectric layer 110 is located between the gate 104 and the substrate 100. The material of the dielectric layer 110 is, for example, silicon oxide. The spacer 112 and the spacer 114 are located on two sidewalls of the gate 104. The SDE region 106 and the SDE region 108 may be respectively located below the spacer 112 and the spacer 114. The spacer 112 and the spacer 114 may be a single-layer structure or a multilayer structure, respectively. The materials of the spacer 112 and the spacer 114 are, for example, silicon oxide, silicon nitride, or a combination thereof.

The first region R1, the second region R2, the third region R3, and the fourth region R4 are located in the substrate 100. The first region R1 and the third region R3 may be the first conductive type (e.g., P-type). The second region R2 and the fourth region R4 may be second conductive type (e.g., N type). There may be PN junctions between the first region R1 and the second region R2, between the second region R2 and the third region R3, and between the third region R3 and the fourth region R4, respectively. In the present embodiment, the PN junction between the second region R2 and the third region R3 may be located directly under the gate 104, but the invention is not limited thereto.

The first region R1 may include a doped region 116. The doped region 116 may be the first conductive type (e.g., P-type). The second region R2 may include a well region 118 and may further include at least one of a doped region 120 and a well region 122. The doped region 116 and the doped region 120 are located in the well region 118. The well region 118 may cover the doped region 116 and the doped region 120. The well region 122 may be a deep well region. The well region 122 may cover the well region 118. The well region 118, the doped region 120, and the well region 122 may be the second conductive type (e.g., N-type). In some embodiments, the SDE region 106 may be used as a portion of the second region R2. The third region R3 may include a well region 124 and a doped region 126. The height of the bottom surface of the well region 118 may be approximately equal to the height of the bottom surface of the well region 124, and the height of the bottom surface of the well region 122 may be lower than the height of the bottom surface of the well region 118 and the height of the bottom surface of the well region 124, but the invention is not limited thereto. The well region 122 may further cover the well region 124. In the present embodiment, the well region 122 may completely cover the well region 118 and the well region 124, but the invention is not limited thereto. The doped region 126 is located in the well region 124. The well region 124 and the doped region 126 may be the first conductive type (e.g., P-type). The fourth region R4 may include a doped region 128. The doped region 128 may be second conductive type (e.g., N-type). The doped region 128 is located in the well region 124. In some embodiments, the SDE region 108 may be used as a portion of the fourth region R4. The doped region 126 and the doped region 128 may be short-circuited, thereby suppressing the parasitic thyristor. In the IGBT structure 10A, the doped region 116 can be used as an anode or a drain, and the short-circuited doped region 126 and doped region 128 can be used as a cathode or a source.

In the present embodiment, the SDE region 106 may be located in the well region 118, and the SDE region 108 may be located in the well region 124, but the invention is not limited thereto.

Furthermore, the shortest distance between the second region R2 and the fourth region R4 under the gate 104 may be defined as the channel length L1 of the IGBT structure 10A.

Moreover, the width of the portion of the gate 104 located above the well region 118 may be equal to, greater than, or less than the width of the portion of the gate 104 located above the well region 124. In the present embodiment, the width of the portion of the gate 104 located above the well region 118 is, for example, approximately equal to the width of the portion of the gate 104 located above the well region 124, but the invention is not limited thereto.

The IGBT structure 10A may further include at least one of a SAB layer 130, a metal silicide layer 132, a metal silicide layer 134, a contact 136, a contact 138, a contact 140, an isolation structure 142a, and an isolation structure 142b.

The SAB layer 130 is located on the substrate 100 between the doped region 116 and the gate 104 and may cover the doped region 120 to prevent the formation of the metal silicide on the doped region 120. The material of the SAB layer 130 is, for example, silicon oxide or silicon nitride.

The metal silicide layer 132 is located on the doped region 116. The metal silicide layer 134 is located on the doped region 126 and the doped region 128. The materials of the metal silicide layer 132 and the metal silicide layer 134 are, for example, cobalt silicide ($CoSi_2$) or nickel silicide (NiSi). The contact 136, the contact 138, and the contact 140 may be respectively connected to the metal silicide layer 132, the metal silicide layer 134, and the gate 104. The materials of the contact 136, the contact 138, and the contact 140 are, for example, a metal such as tungsten.

In the present embodiment, the doped region 126 and the doped region 128 may be short-circuited by the metal silicide layer 134, but the invention is not limited thereto. In other embodiments, without forming the metal silicide layer 134, the contact 138 may be simultaneously connected to the doped region 126 and the doped region 128, so that the doped region 126 and the doped region 128 are short-circuited.

The isolation structure 142a and the isolation structure 142b are located in the substrate 100 on two sides of the gated PNPN diode 102. The isolation structure 142a and the isolation structure 142b are, for example, shallow trench isolations (STI) structures. The materials of the isolation structure 142a and the isolation structure 142b are, for example, silicon oxide.

In addition, the IGBT structure 10A may further include a required dielectric layer (not shown) or interconnection structure (not shown), and the description thereof is omitted here in order to simplify the diagram.

On the other hand, the manufacturing method of the IGBT structure 10A may use the manufacturing method of the MOS device 20 to manufacture the IGBT structure 10A, as described below. In the present embodiment, the MOS device 20 may be a MOSFET such as a laterally diffused metal oxide semiconductor (LDMOS) transistor.

Referring to FIG. 1, the difference between the IGBT structure 10A and the MOS device 20 is as follows. In the structure of the MOS device 20, the SAB layer 130 located between the doped region 116 and the gate 104 is omitted. Therefore, in the subsequent metal silicide process, a metal silicide layer 132a connected to the doped region 116 and the doped region 120 is formed. In addition, similar components in the IGBT structure 10A and the MOS device 20 are denoted by the same symbol and may be manufactured by using the same process. In this way, the manufacturing method of the IGBT structure 10A may use the manufacturing method of the MOS device 20 to manufacture the IGBT structure 10A. Although the IGBT structure 10A is similar to the structure of the MOS device 20, the electrical principles of the two are different. The reason is that the MOS device 20 is a MOSFET, the doped region 116 and the doped region 120 in the MOS device 20 are short-circuited via the metal silicide layer 132a, and the function of the diode is lost. On the other hand, the IGBT structure 10A combines the MOSFET and the BJT. In addition, the manufacturing method of the MOS device 20 is well known to one of ordinary skill in the art, and the description thereof is omitted here. In FIG. 1, the size of each component of the IGBT structure 10A and the MOS device 20 may be adjusted separately according to product requirements.

In the present embodiment, the MOS device 20 is, for example, a LDMOS transistor, but the invention is not limited thereto. In other embodiments, the MOS device 20 may be other types of MOS devices. That is, the manufacturing method of the IGBT structure 10A can be integrated with the manufacturing method of other types of the MOS device 20.

Based on the above embodiment, in the IGBT structure 10A and the manufacturing method thereof, the gated PNPN diode 102 includes the gate 104, the SDE region 106, and the SDE region 108, and the SDE region 106 and the SDE region 108 are located in the substrate 100 on two sides of the gate 104. Since the IGBT structure 10A can be manufactured by using the manufacturing method of the MOS device, the manufacturing process of the IGBT structure 10A can be integrated with the manufacturing process of the MOS device (or the CMOS device), so that the process complexity can be reduced.

FIG. 2 to FIG. 21 are cross-sectional views illustrating IGBT structures according to other embodiments of the invention.

Figure 2:
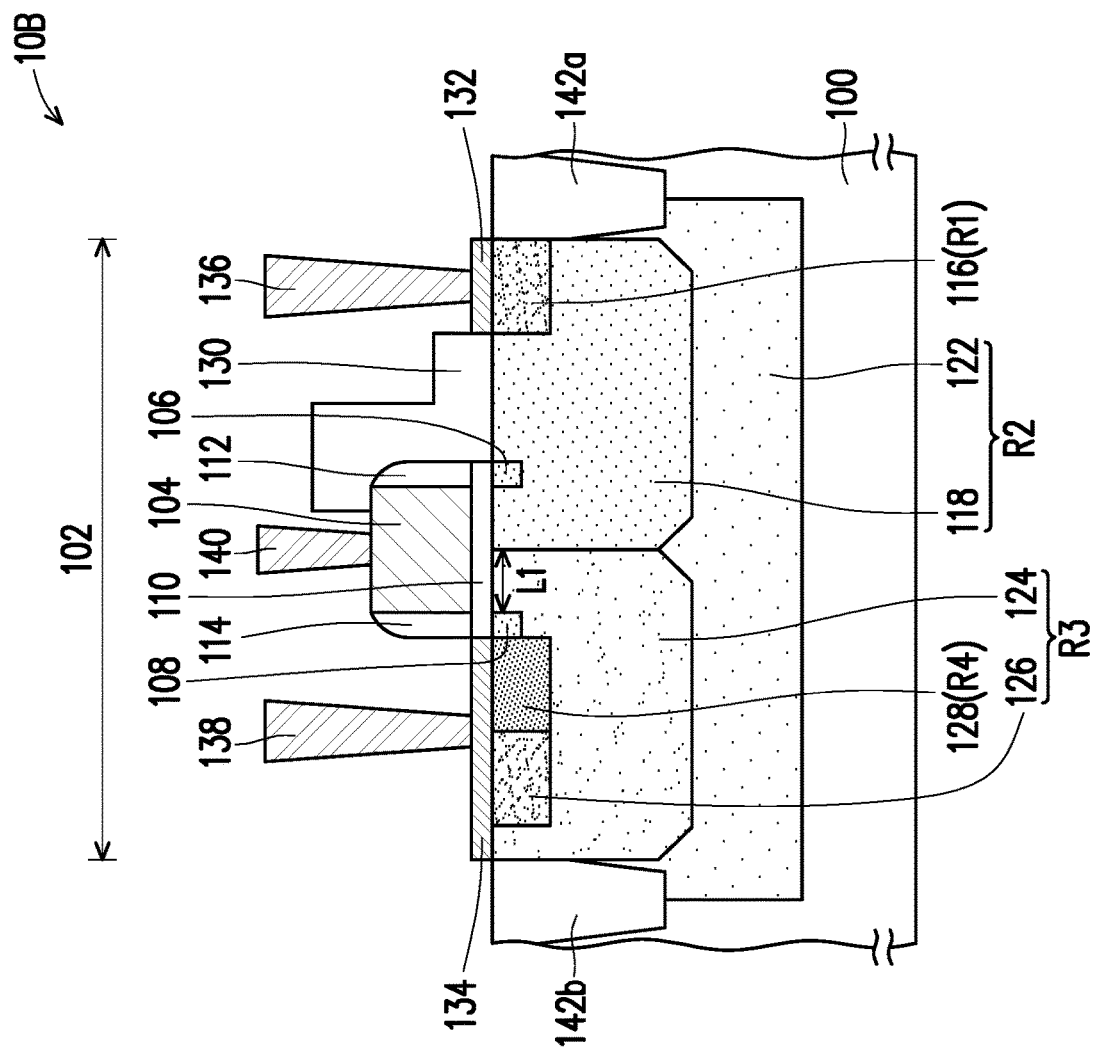
FIG. 2 to FIG. 21 are cross-sectional views illustrating IGBT structures according to other embodiments of the invention.

Referring to FIG. 1 and FIG. 2, the difference between the IGBT structure 10B of FIG. 2 and the IGBT structure 10A of FIG. 1 is as follows. In FIG. 2, the second region R2 of the IGBT structure 10B does not include the doped region 120 in FIG. 1. In addition, the same components in the IGBT structure 10B and the IGBT structure 10A are denoted by the same symbols, and the description thereof is omitted here.

Figure 3:
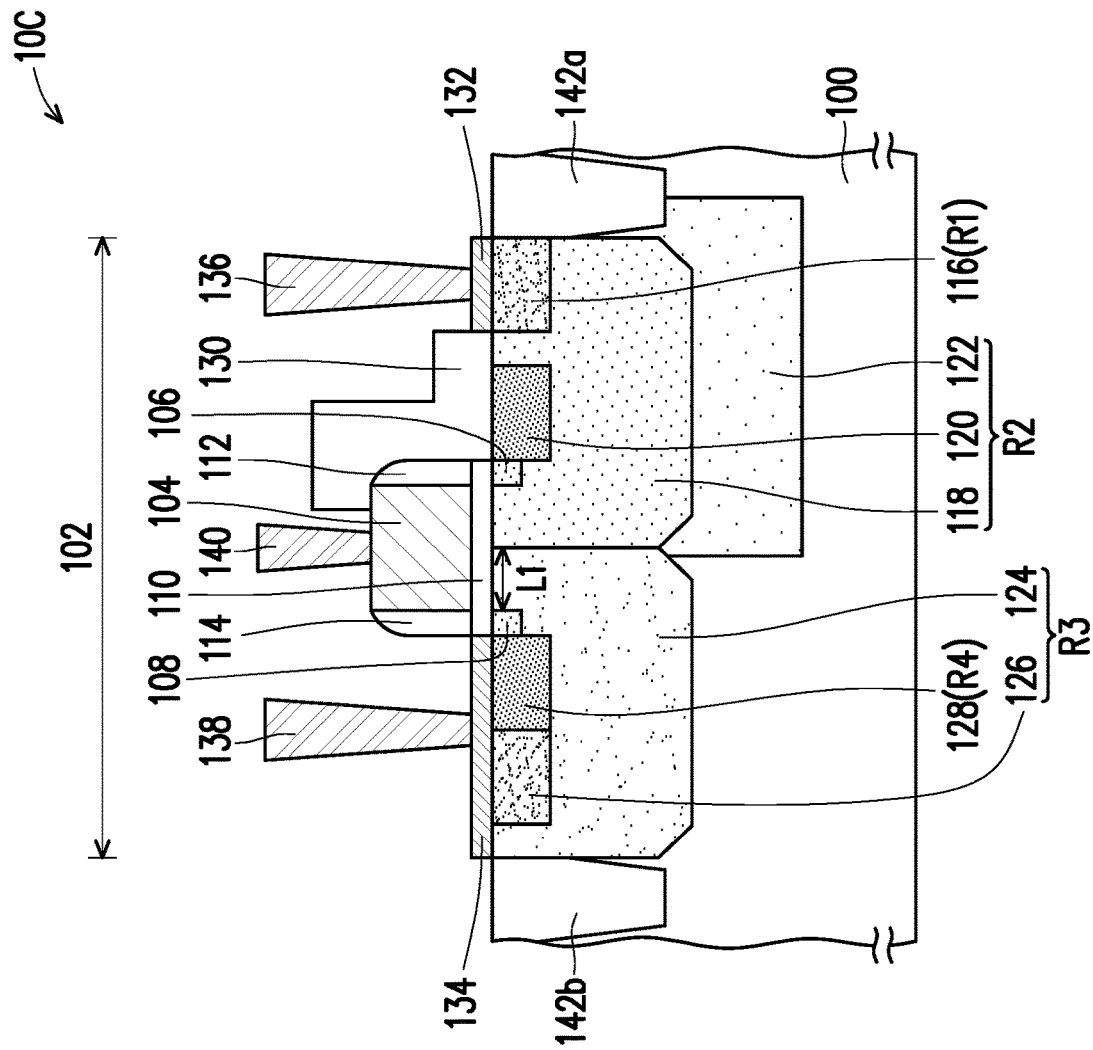

Referring to FIG. 1 and FIG. 3, the difference between the IGBT structure 10C of FIG. 3 and the IGBT structure 10A of FIG. 1 is as follows. In FIG. 3, the well region 122 of the IGBT structure 10C does not completely cover the well region 124. That is, the well region 122 of the IGBT structure 10C does not completely isolate the well region 124 from the substrate 100. In addition, the same components in the IGBT structure 10C and the IGBT structure 10A are denoted by the same symbols, and the description thereof is omitted here.

Figure 4:
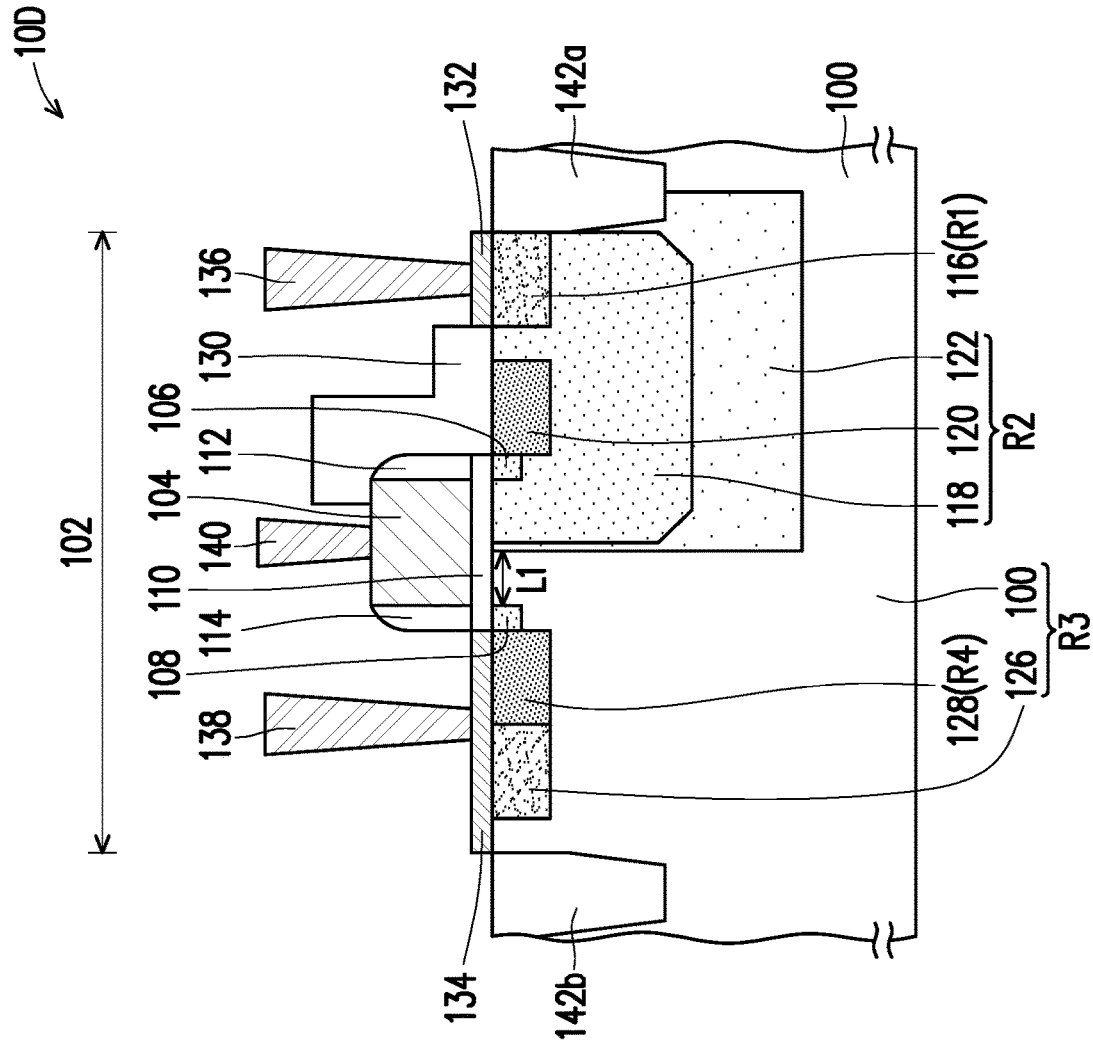

Referring to FIG. 3 and FIG. 4, the difference between the IGBT structure 10D of FIG. 4 and the IGBT structure 10C of FIG. 3 is as follows. In the IGBT structure 10D of FIG. 4, the substrate 100 may be the first conductive type (e.g., P-type). The third region R3 of the IGBT structure 10D may include the substrate 100 and the doped region 126, but does not include the well region 124 in FIG. 3. The doped region 126 and the doped region 128 are located in the substrate 100. In addition, the same components in the IGBT structure 10D and the IGBT structure 10C are denoted by the same symbols, and the description thereof is omitted here.

Figure 5:
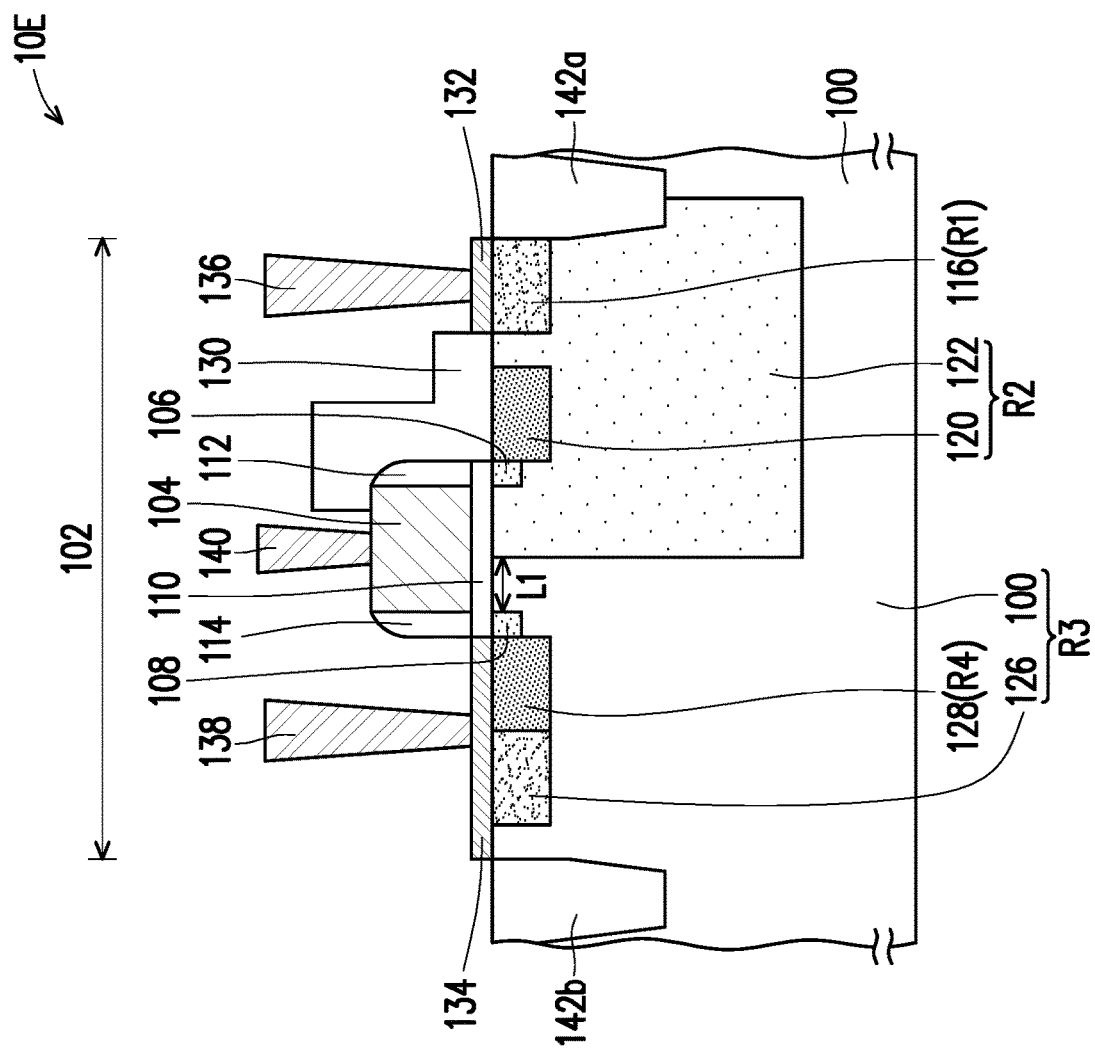

Referring to FIG. 4 and FIG. 5, the difference between the IGBT structure 10E of FIG. 5 and the IGBT structure 10D of FIG. 4 is as follows. In FIG. 5, the second region R2 of the IGBT structure 10E does not include the well region 118 in FIG. 4, and the doped region 116 and the doped region 120 are located in the well region 122. In addition, the same components in the IGBT structure 10E and the IGBT structure 10D are denoted by the same symbols, and the description thereof is omitted here.

Figure 6:
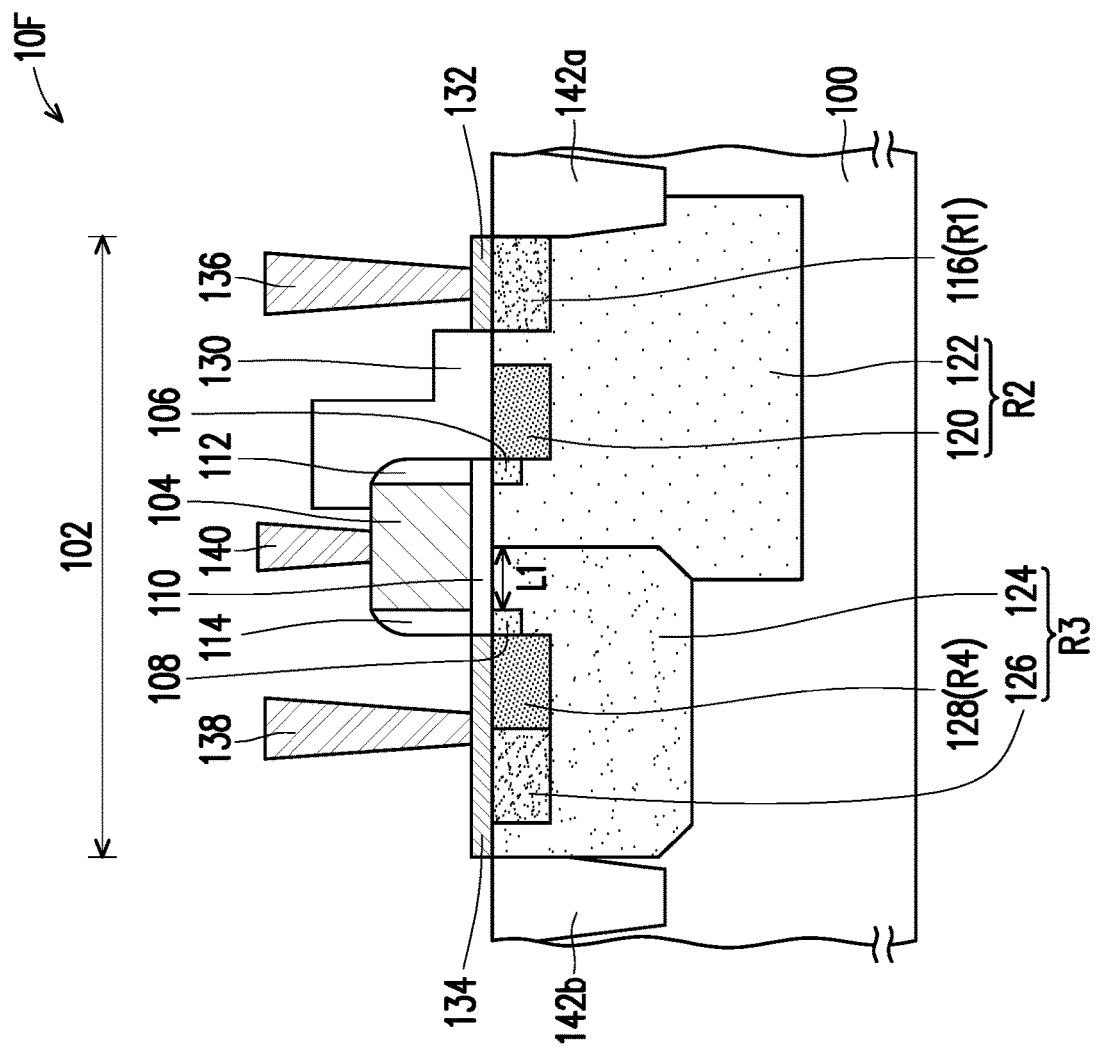

Referring to FIG. 3 and FIG. 6, the difference between the IGBT structure 10F of FIG. 6 and the IGBT structure 10C of FIG. 3 is as follows. In FIG. 6, the second region R2 of the IGBT structure 10F does not include the well region 118 in FIG. 3, and the doped region 116 and the doped region 120 are located in the well region 122. In addition, the same components in the IGBT structure 10F and the IGBT structure 10C are denoted by the same symbols, and the description thereof is omitted here.

Figure 7:
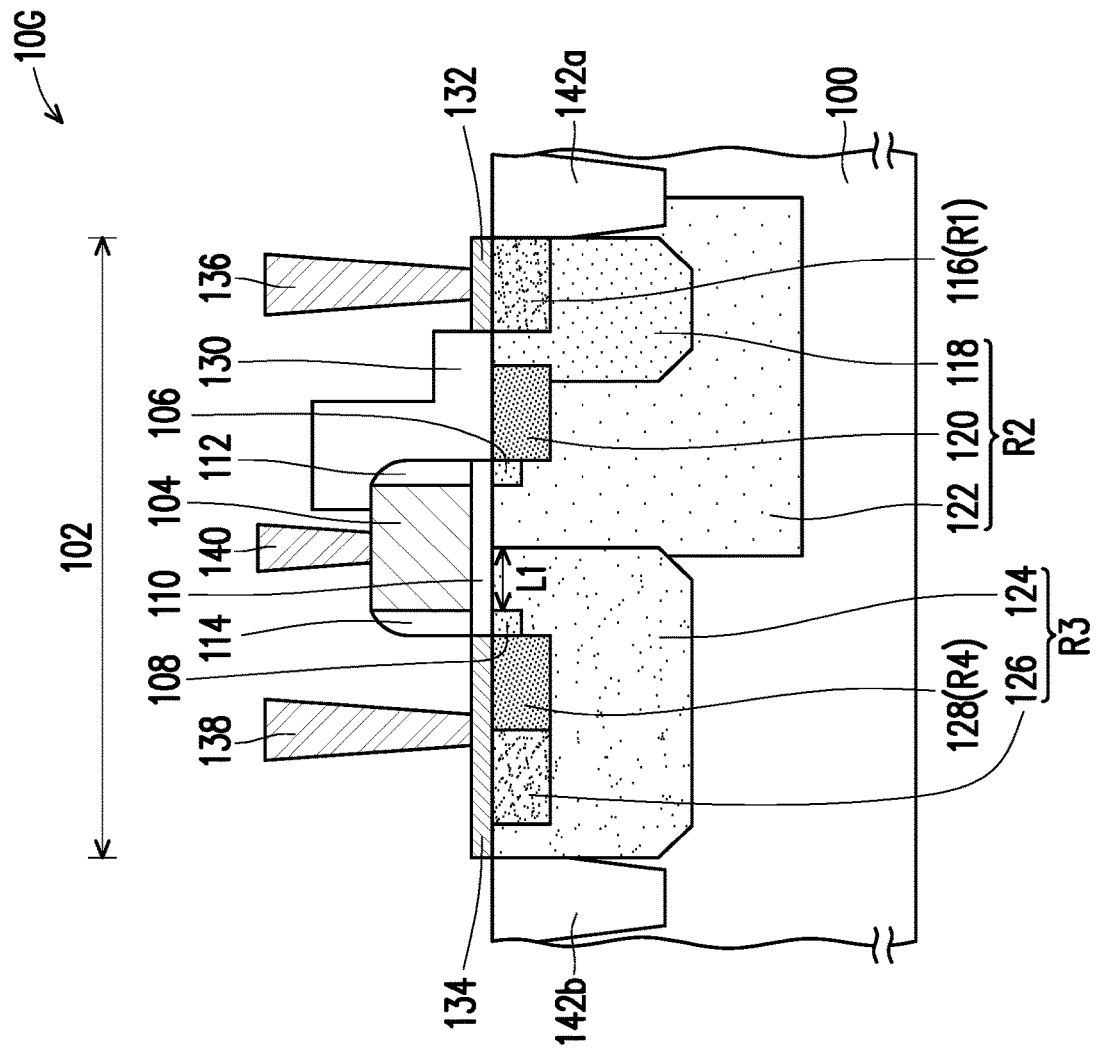

Referring to FIG. 3 and FIG. 7, the difference between the IGBT structure 10G of FIG. 7 and the IGBT structure 10C of FIG. 3 is as follows. In FIG. 7, the well region 118 of the IGBT structure 10G only completely covers the doped region 116, but does not completely cover the doped region 120. In addition, the same components in the IGBT structure 10G and the IGBT structure 10C are denoted by the same symbols, and the description thereof is omitted here.

Figure 8:
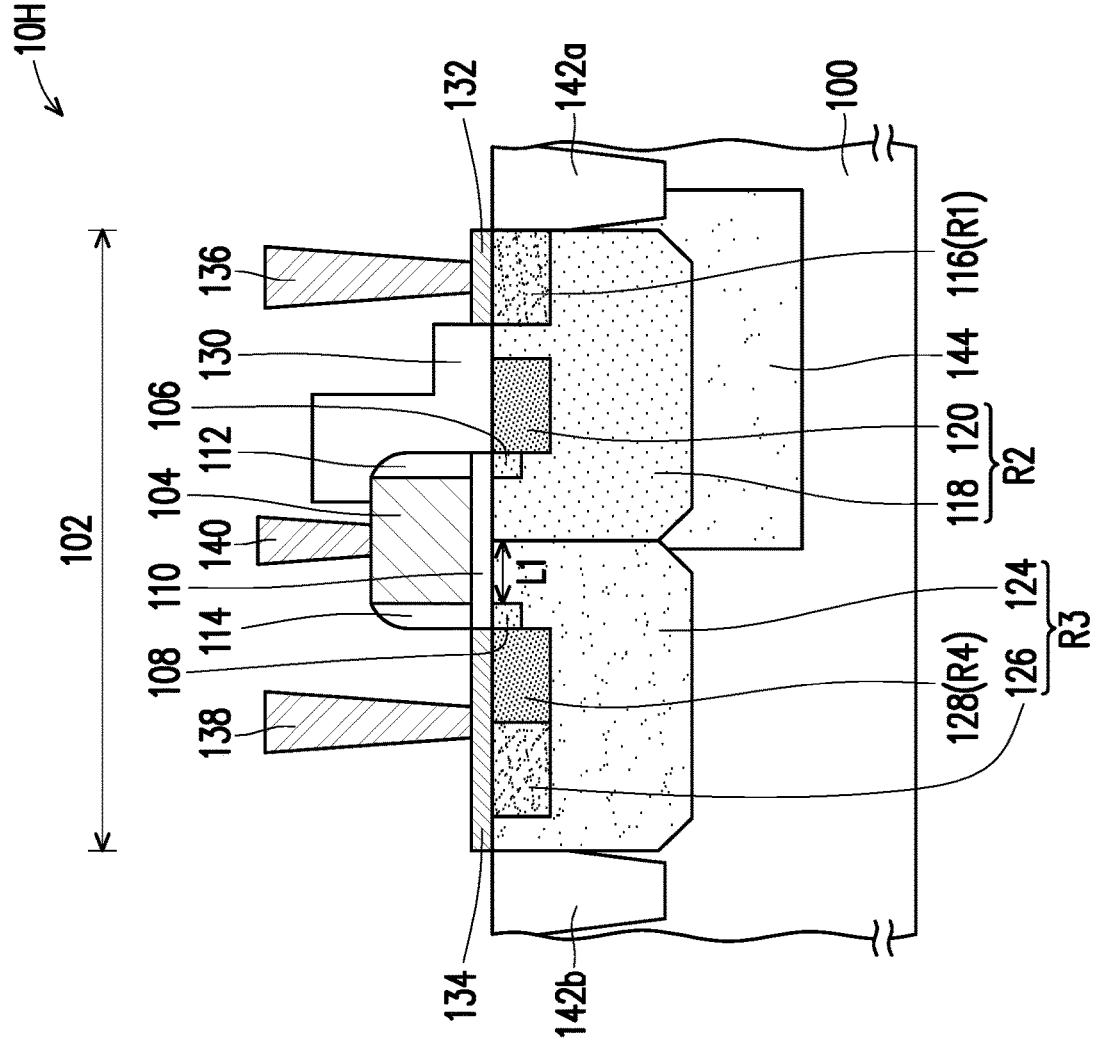

Referring to FIG. 3 and FIG. 8, the difference between the IGBT structure 10H of FIG. 8 and the IGBT structure 10C of FIG. 3 is as follows. In FIG. 8, the second region R2 of the IGBT structure 10H does not include the well region 122 in FIG. 3. Furthermore, the IGBT structure 10H may further include a well region 144. The well region 144 is located in the Substrate 100. The well region 144 may be the first conductive type (e.g., P-type). In the present embodiment, the well region 144 may completely cover the well region 118, but the invention is not limited thereto. The well region 144 may be a high voltage well region or a deep well region. In addition, the same components in the IGBT structure 10H and the IGBT structure 10C are denoted by the same symbols, and the description thereof is omitted here.

Figure 9:
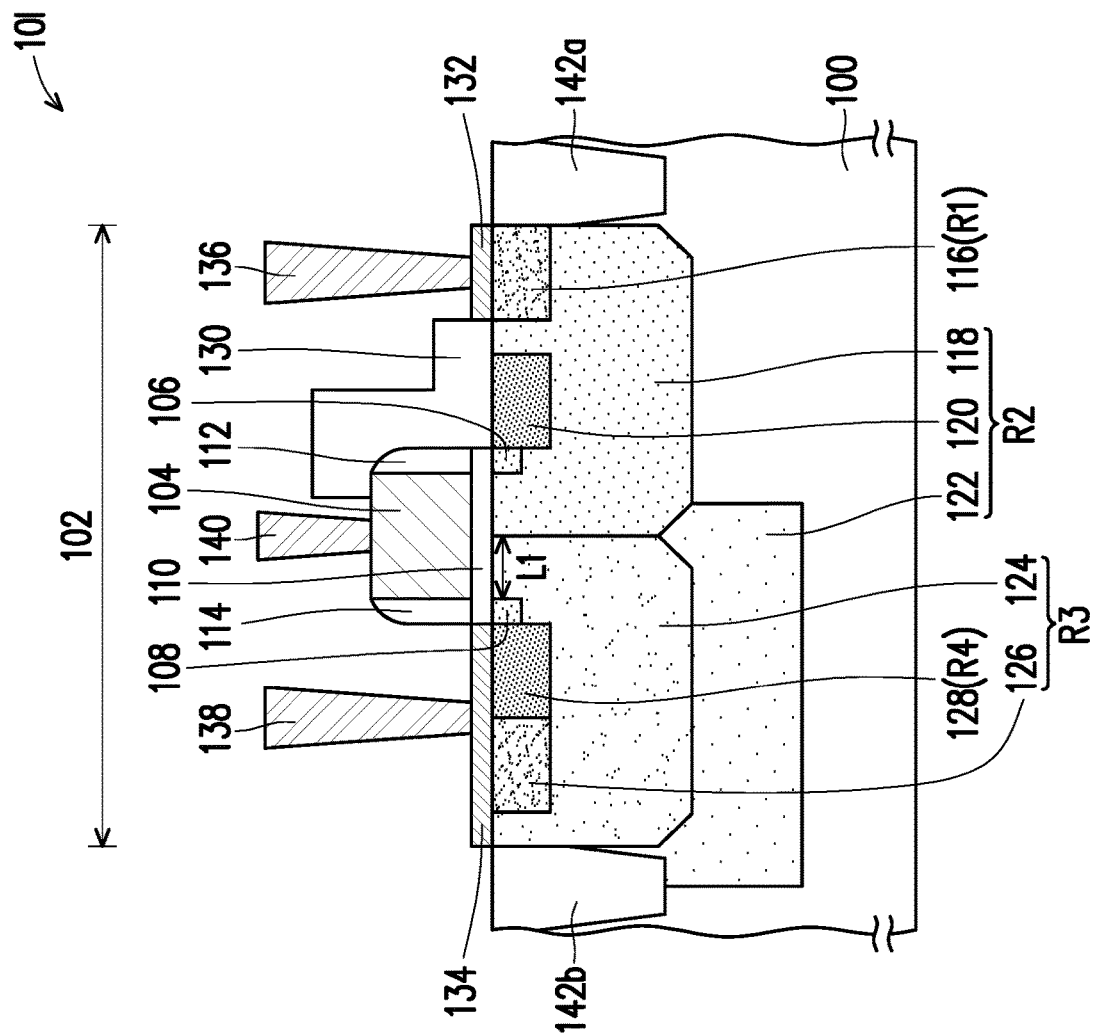

Referring to FIG. 1 and FIG. 9, the difference between the IGBT structure 10I of FIG. 9 and the IGBT structure 10A of FIG. 1 is as follows. In FIG. 9, the well region 122 of the IGBT structure 10I may partially cover the well region 118. Furthermore, the well region 122 of the IGBT structure 10I may completely cover the well region 124 to isolate the well region 124 from the substrate 100. In addition, the same components in the IGBT structure 10I and the IGBT structure 10A are denoted by the same symbols, and the description thereof is omitted here.

Figure 10:
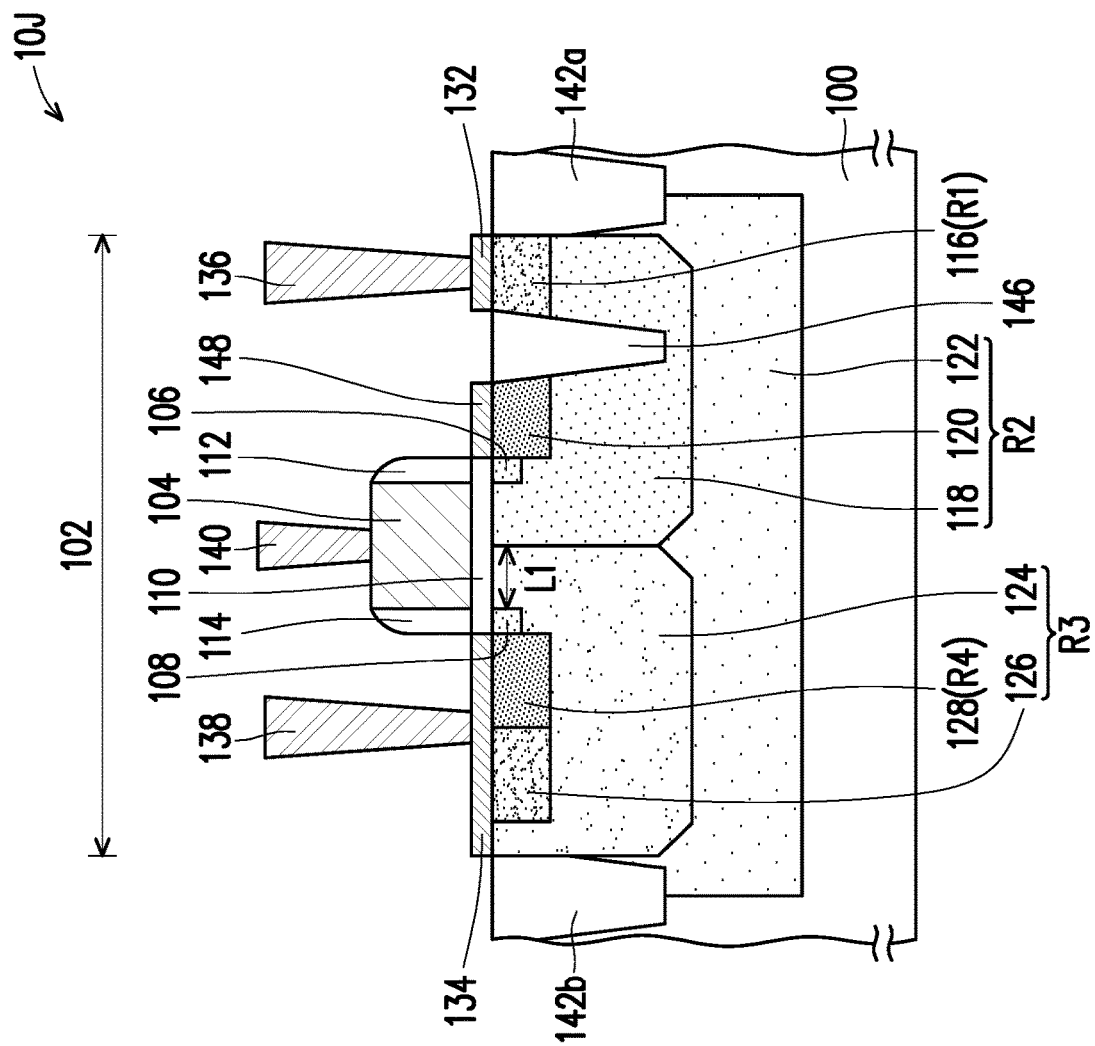

Referring to FIG. 1 and FIG. 10, the difference between the IGBT structure 10J of FIG. 10 and the IGBT structure 10A of FIG. 1 is as follows. In FIG. 10, the IGBT structure 10J does not include the SAB layer 130 in FIG. 1. In addition, the IGBT structure 10J may further include an isolation structure 146. The isolation structure 146 is located in the substrate 100 between the doped region 116 and the doped region 120 to isolate the doped region 116 from the doped region 120. The isolation structure 146 is, for example, a STI structure. The material of the isolation structure 146 is, for example, silicon oxide. Furthermore, the IGBT structure 10J may further include a metal silicide layer 148. The metal silicide layer 148 is located on the doped region 120. The material of the metal silicide layer 148 is, for example, cobalt silicide or nickel silicide. In addition, the same components in the IGBT structure 10J and the IGBT structure 10A are denoted by the same symbols, and the description thereof is omitted here.

Figure 11:
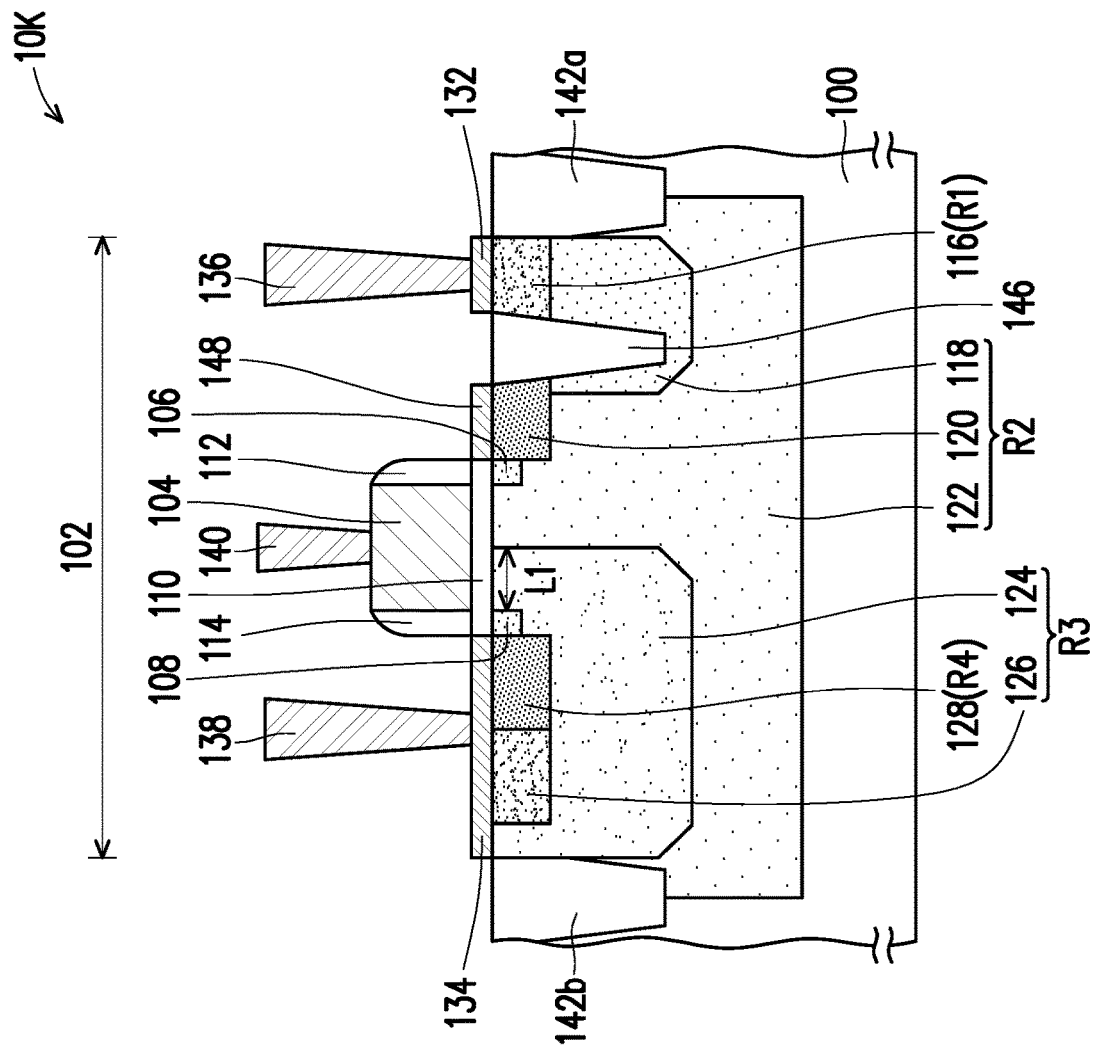

Referring to FIG. 10 and FIG. 11, the difference between the IGBT structure 10K of FIG. 11 and the IGBT structure 10J of FIG. 10 is as follows. In FIG. 11, the well region 118 of the IGBT structure 10K only completely covers the doped region 116, but does not completely cover the doped region 120. In addition, the same components in the IGBT structure 10K and the IGBT structure 10J are denoted by the same symbols, and the description thereof is omitted here.

Figure 12:
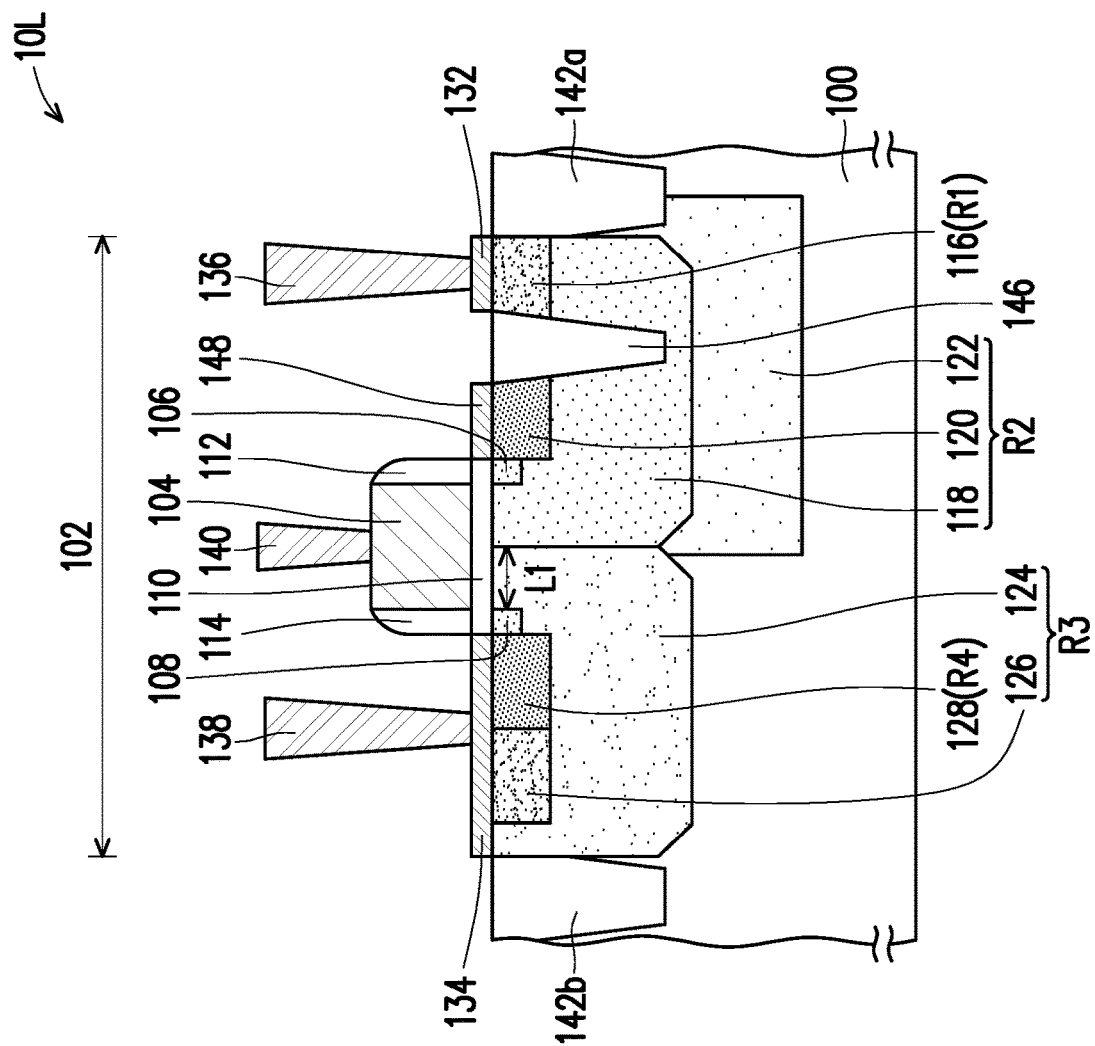

Referring to FIG. 10 and FIG. 12, the difference between the IGBT structure 10L of FIG. 12 and the IGBT structure 10J of FIG. 10 is as follows. In FIG. 12, the well region 122 of the IGBT structure 10L does not completely cover the well region 124. That is, the well region 122 of the IGBT structure 10L does not completely isolate the well region 124 from the substrate 100. In addition, the same components in the IGBT structure 10L and the IGBT structure 10J are denoted by the same symbols, and the description thereof is omitted here.

Figure 13:
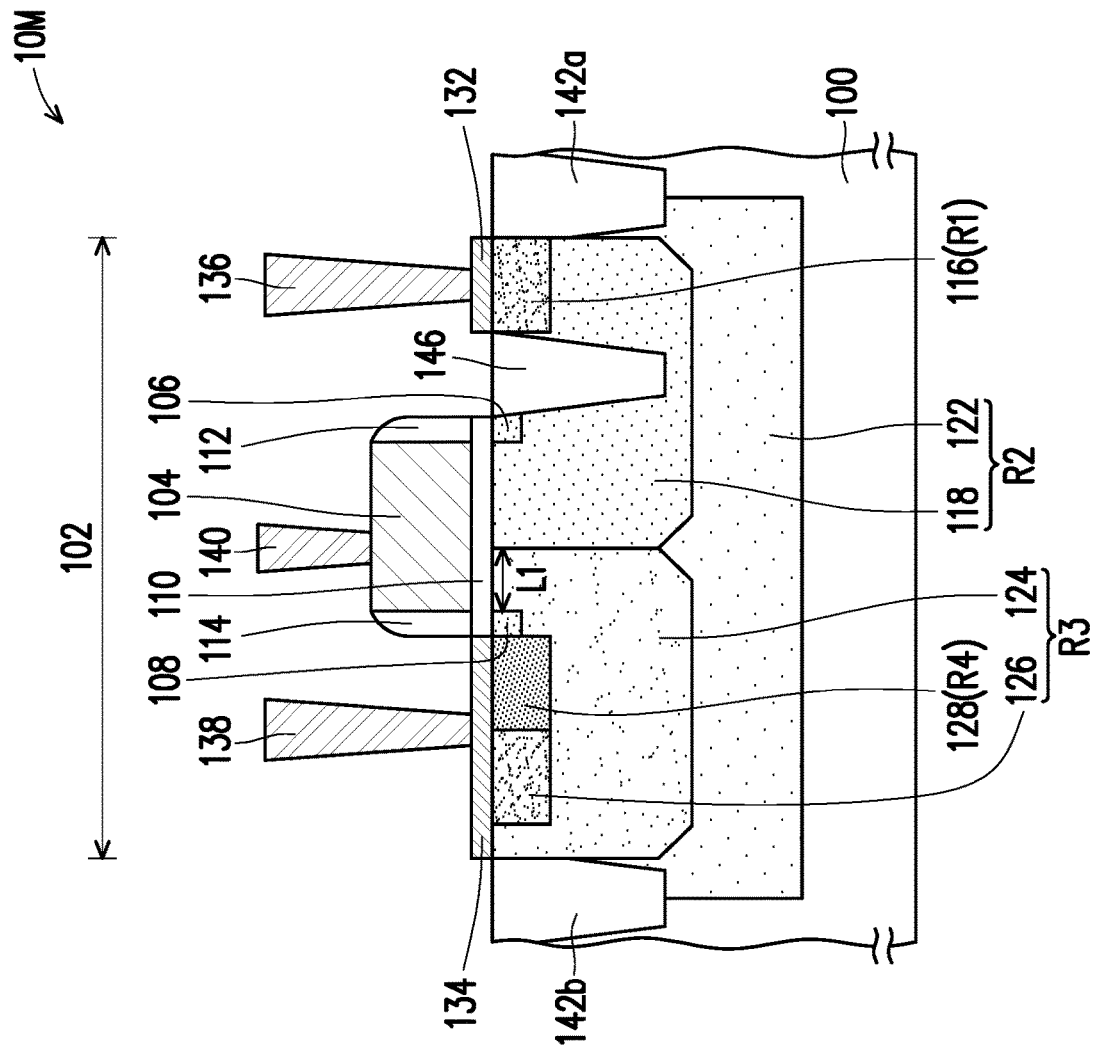

Referring to FIG. 10 and FIG. 13, the difference between the IGBT structure 10M of FIG. 13 and the IGBT structure 10J of FIG. 10 is as follows. In FIG. 13, the IGBT structure 10M does not include the doped region 120 and the metal silicide layer 148 in FIG. 10. Furthermore, the gate 104 may extend toward the first region R1 (the doped region 116), so that the width of the portion of the gate 104 located above the well region 118 may be greater than the width of the portion of the gate 104 located above the well region 124. In this way, the field plate can be formed to improve the uniformity of the electric field. In addition, the same components in the IGBT structure 10M and the IGBT structure 10J are denoted by the same symbols, and the description thereof is omitted here.

Figure 14:
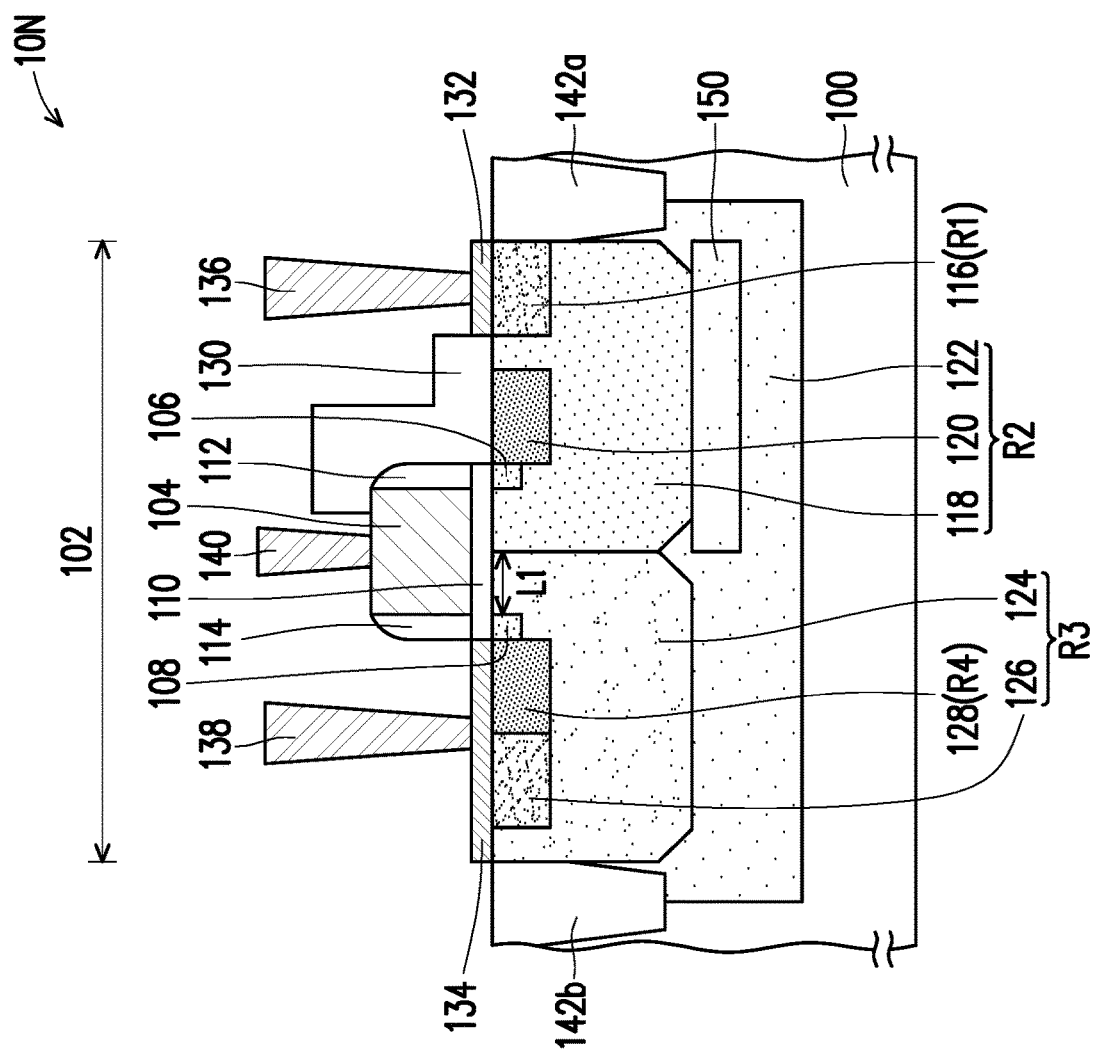

Referring to FIG. 1 and FIG. 14, the difference between the IGBT structure 10N of FIG. 14 and the IGBT structure 10A of FIG. 1 is as follows. In FIG. 14, the IGBT structure 10N may further include a well region 150. The well region 150 is located in the substrate 100. For example, the well region 150 may be located in the well region 122. The well region 150 may be the first conductive type (e.g., P-type). The well region 150 may partially cover the well region 118. In this way, the double RESURF (reduced surface field) structure can be formed to improve the withstand voltage of the anode. Furthermore, the well region 150 may be a deep well region. In addition, the same components in the IGBT structure 10N and the IGBT structure 10J are denoted by the same symbols, and the description thereof is omitted here.

Figure 15:
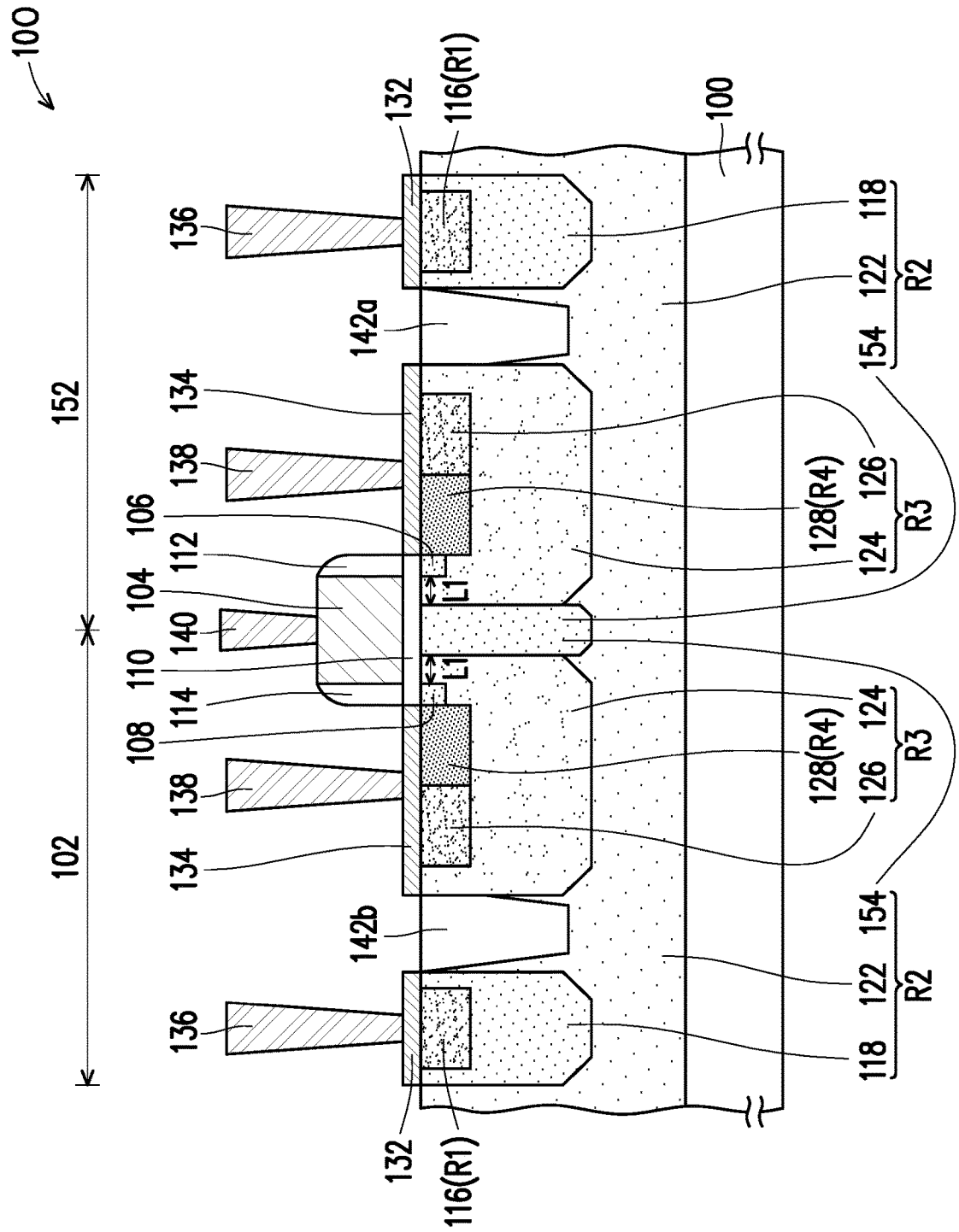

Referring to FIG. 2 and FIG. 15, the difference between the IGBT structure 10O of FIG. 15 and the IGBT structure 10B of FIG. 2 is as follows. In the IGBT structure 10B of FIG. 2, the first region R1 (the doped region 116) and the fourth region R4 (the doped region 128) are located on different sides of the gate 104 and on the same side of the isolation structure 142b. Furthermore, the SDE region 106 of the IGBT structure 10B is located in the second region R2 (e.g., the well region 118). On the other hand, in the IGBT structure 10O of FIG. 15, the first region R1 (the doped region 116) and the fourth region R4 (the doped region 128) are located on the same side of the gate 104 and on different sides of the isolation structure 142b. In addition, the IGBT structure 10O does not include the SAB layer 130 in FIG. 2. Furthermore, the IGBT structure 10O itself may be a mirror-symmetric structure. For example, the IGBT structure 10O may further include a gated PNPN diode 152. The gated PNPN diode 152 is located on the substrate 100. The gated PNPN diode 102 and the gated PNPN diode 152 may be mirror-symmetric and may share the gate 104. Moreover, the second region R2 may further include a well region 154. The gated PNPN diode 102 and the gated PNPN diode 152 may share the well region 154. The well region 154 is located between the well region 124 of the gated PNPN diode 102 and the well region 124 of the gated PNPN diode 152. The well region 154 is connected to the well region 122. The well region 154 may be the second conductive type (e.g., N-type). The SDE region 106 of the IGBT structure 10O is located in the third region R3 (e.g., the well region 124) of the gated PNPN diode 152. In addition, the same components in the IGBT structure 10O and the IGBT structure 10B are denoted by the same symbols, and the description thereof is omitted here.

Figure 16:
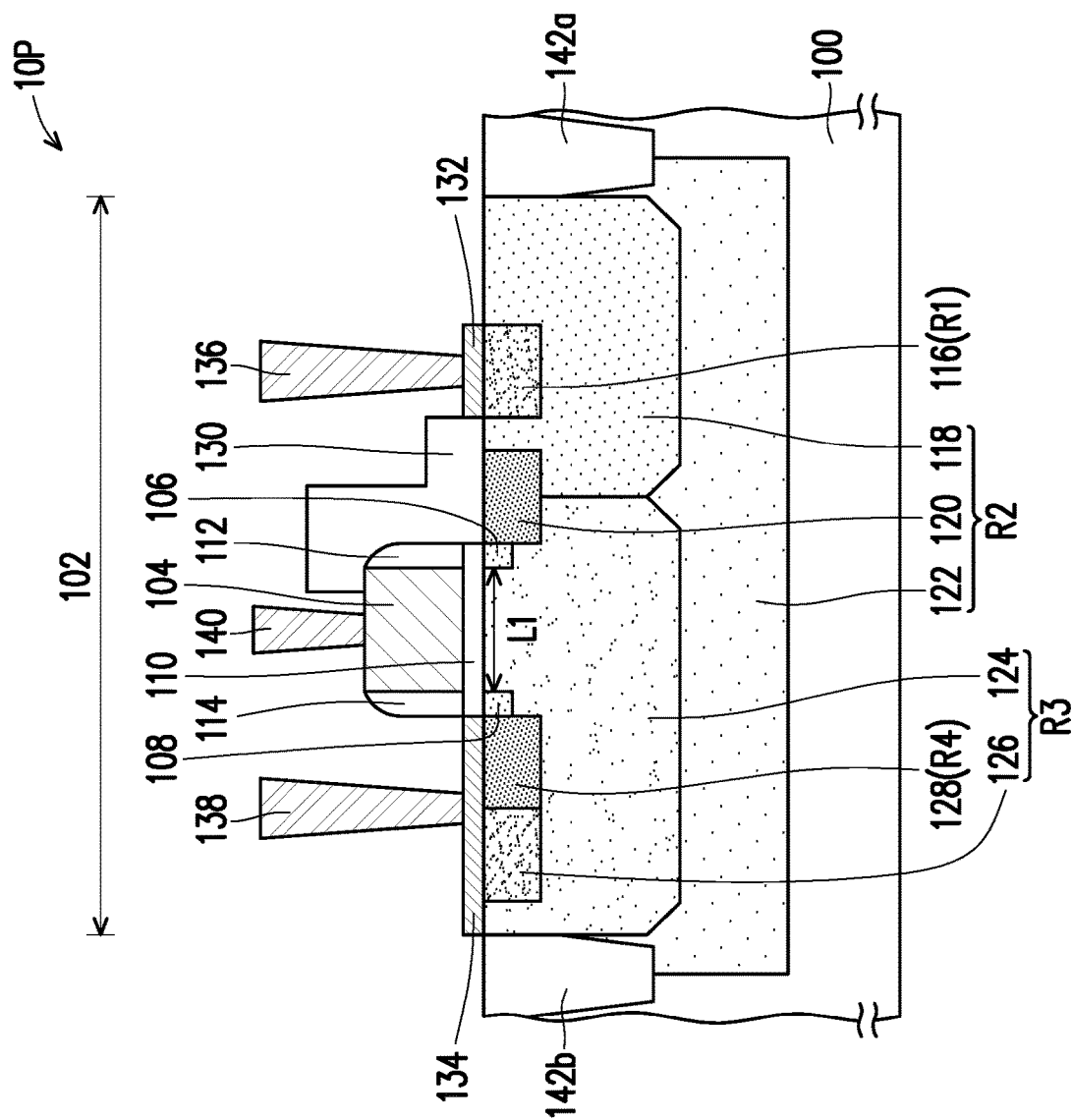

Referring to FIG. 1 and FIG. 16, the difference between the IGBT structure 10P of FIG. 16 and the IGBT structure 10A of FIG. 1 is as follows. In FIG. 16, the PN junction between the second region R2 and the third region R3 may be located on one side of the gate 104.

Furthermore, the doped region 120 may be further located in the well region 124 in addition to the well region 118. In this way, a self-aligned channel may be defined by the gate 104, the doped region 120, and the doped region 128. The channel length L1 of the IGBT structure 10P is the shortest distance between the second region R2 and the fourth region R4 under the gate 104. Moreover, the SDE region 106 and the SDE region 108 are located in the third region R3 (e.g., the well region 124). In addition, the same components in the IGBT structure 10P and the IGBT structure 10A are denoted by the same symbols, and the description thereof is omitted here.

Figure 17:
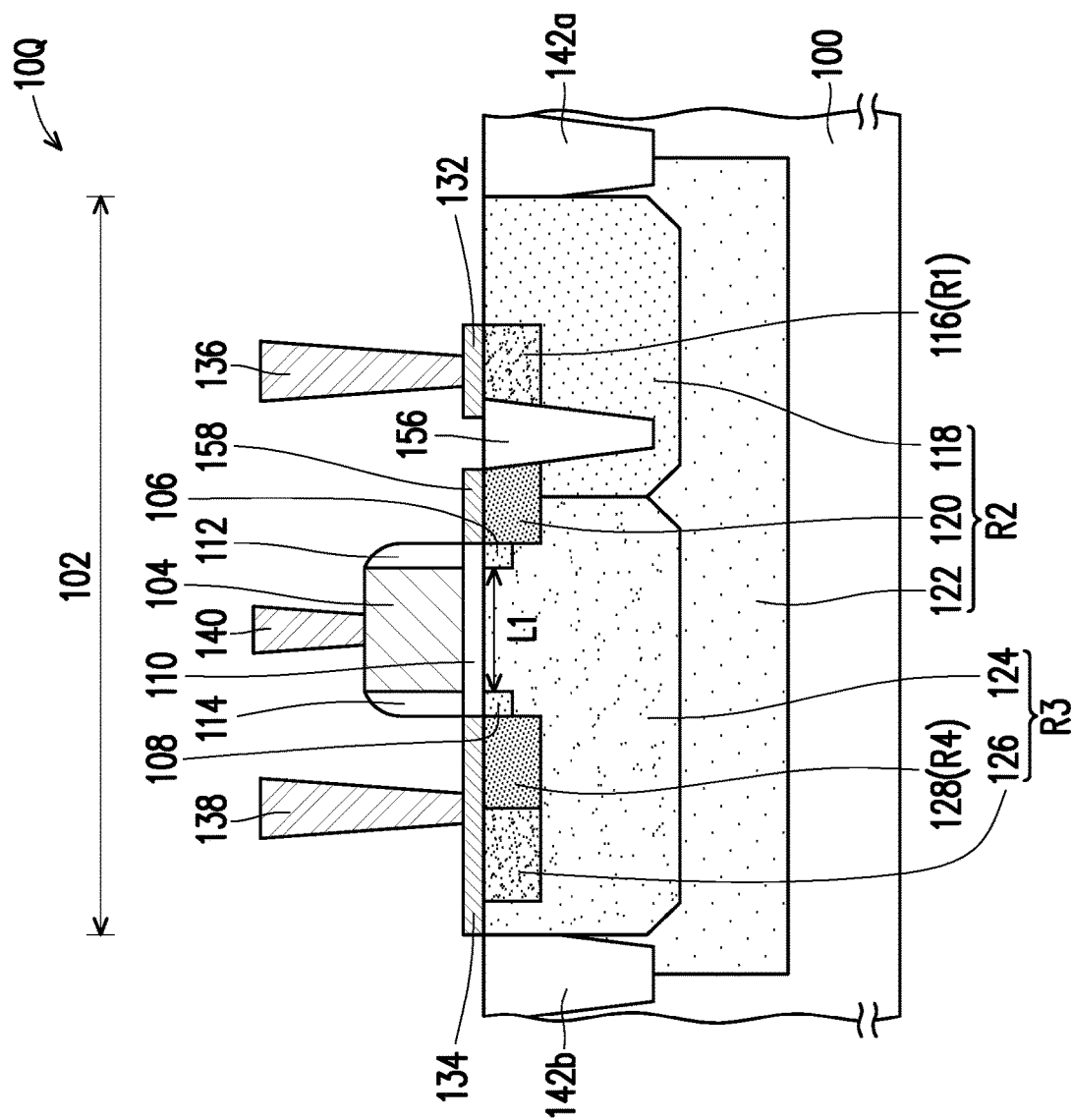

Referring to FIG. 16 and FIG. 17, the difference between the IGBT structure 10Q of FIG. 17 and the IGBT structure 10P of FIG. 16 is as follows. The IGBT structure 10Q does not include the SAB layer 130 in FIG. 16. Furthermore, the IGBT structure 10Q may further include an isolation structure 156. The isolation structure 156 is located in the substrate 100 between the doped region 116 and the doped region 120 to isolate the doped region 116 from the doped region 120. The isolation structure 156 is, for example, a STI structure. The material of the isolation structure 156 is, for example, silicon oxide. Moreover, the IGBT structure 10Q may further include a metal silicide layer 158. The metal silicide layer 158 is located on the doped region 120. The material of the metal silicide layer 158 is, for example, cobalt silicide or nickel silicide. In addition, the same components in the IGBT structure 10Q and the IGBT structure 10P are denoted by the same symbols, and the description thereof is omitted here.

Figure 18:
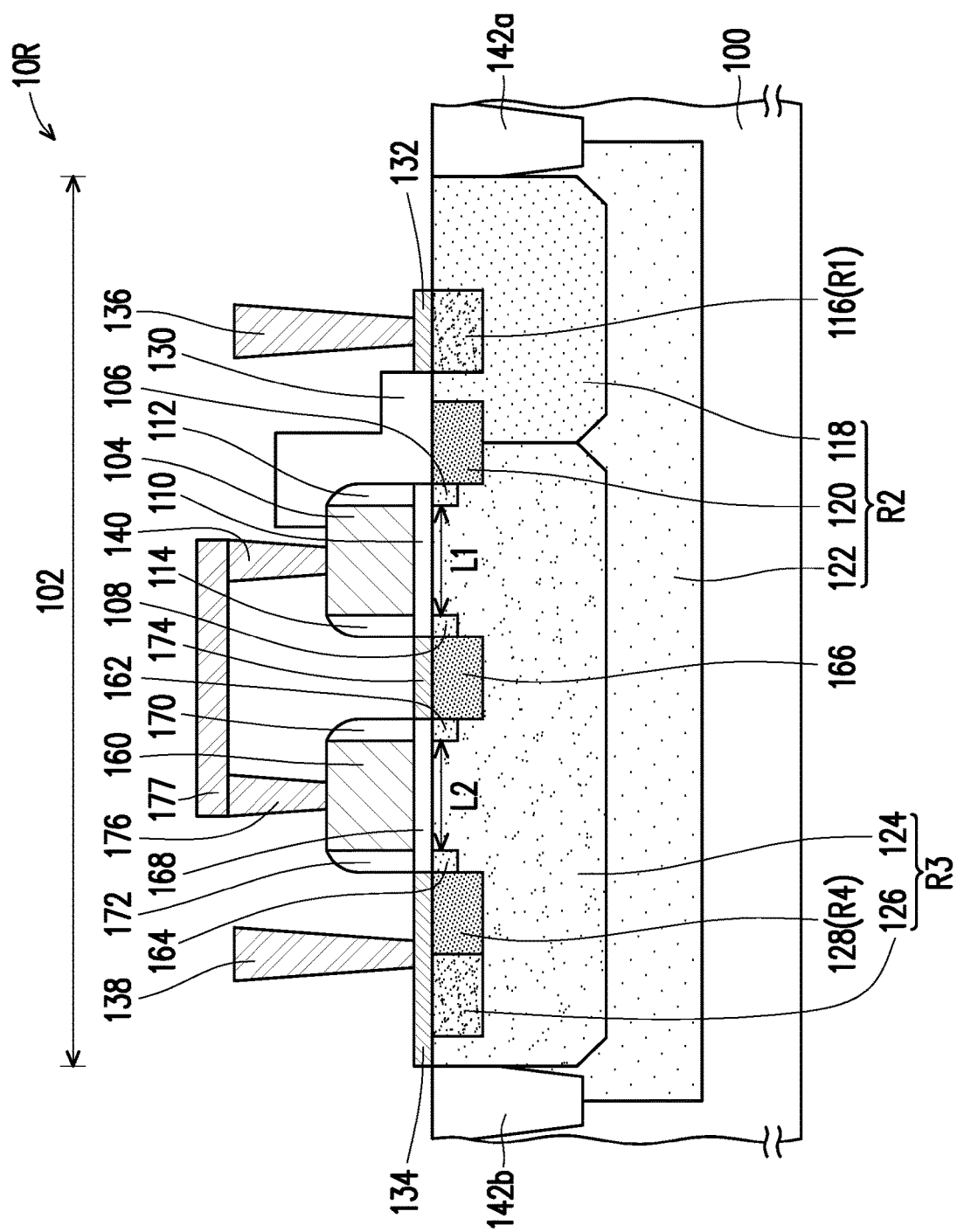

Referring to FIG. 16 and FIG. 18, the difference between the IGBT structure 10R of FIG. 18 and the IGBT structure 10P of FIG. 16 is as follows. In the IGBT structure 10R of FIG. 18, the gated PNPN diode 102 further includes a gate 160, a SDE region 162, a SDE region 164, and a doped region 166. The gate 160 is located on the substrate 100. The gate 104 and the gate 160 are spaced apart above the well region 124. The gate 160 may be a planar gate or a recessed gate. In the present embodiment, the gate 160 is, for example, a planar gate, but the invention is not limited thereto. The gate 160 may have a flat lower surface. The material of the gate 160 is, for example, doped polysilicon. The SDE region 162 and the SDE region 164 are located in the well region 124 on two sides of the gate 160. The SDE region 162 and the SDE region 164 may be the second conductive type (e.g., N-type). The doped region 166 is located in the well region 124 between the gate 104 and the gate 160. The doped region 166 may be the second conductive type (e.g., N-type).

In the present embodiment, the SDE region 106 may be used as a portion of the second region R2, the SDE region 108 and the SDE region 162 may be used as the extension region of the doped region 166, and the SDE region 164 may be a portion of the fourth region R4.

Furthermore, in the IGBT structure 10R, the gated PNPN diode 102 may further include at least one of a dielectric layer 168, a spacer 170, a spacer 172, a metal silicide layer 174, a contact 176, and a conductive line 177. The dielectric layer 168 is located between the gate 160 and the substrate 100. The material of the dielectric layer 168 is, for example, silicon oxide. The spacer 170 and the spacer 172 are located on two sidewalls of the gate 160. The SDE region 162 and the SDE region 164 may be respectively located below the spacer 170 and the spacer 172. The spacer 170 and the spacer 172 may be a single-layer structure or a multilayer structure, respectively. The materials of the spacer 170 and the spacer 172 are, for example, silicon oxide, silicon nitride, or a combination thereof. The metal silicide layer 174 is located on the doped region 166. The material of the metal silicide layer 174 is, for example, cobalt silicide or nickel silicide. The contact 176 may be connected to the gate 160. The material of the contact 176 is, for example, a metal such as tungsten. The conductive line 177 may be connected between the contact 140 and the contact 176, whereby the gate 104 and the gate 160 can be electrically connected. The material of the conductive line 177 is, for example, a metal such as aluminum or tungsten.

In addition, the same components in the IGBT structure 10R and the IGBT structure 10P are denoted by the same symbols, and the description thereof is omitted here.

In the present embodiment, a self-aligned channel may be defined by multiple gates connected in series (e.g., the gate 104 and the gate 160 connected in series), the doped region 120, the doped region 166, and the doped region 128. The channel length L1 of the IGBT structure 10R may be the shortest distance between the SDE region 106 and the SDE region 108 under the gate 104. The channel length L2 of the IGBT structure 10R may be the shortest distance between the SDE region 162 and the SDE region 164 under the gate 160. In this way, the IGBT structure 10R can have a longer effective channel length.

Figure 19:
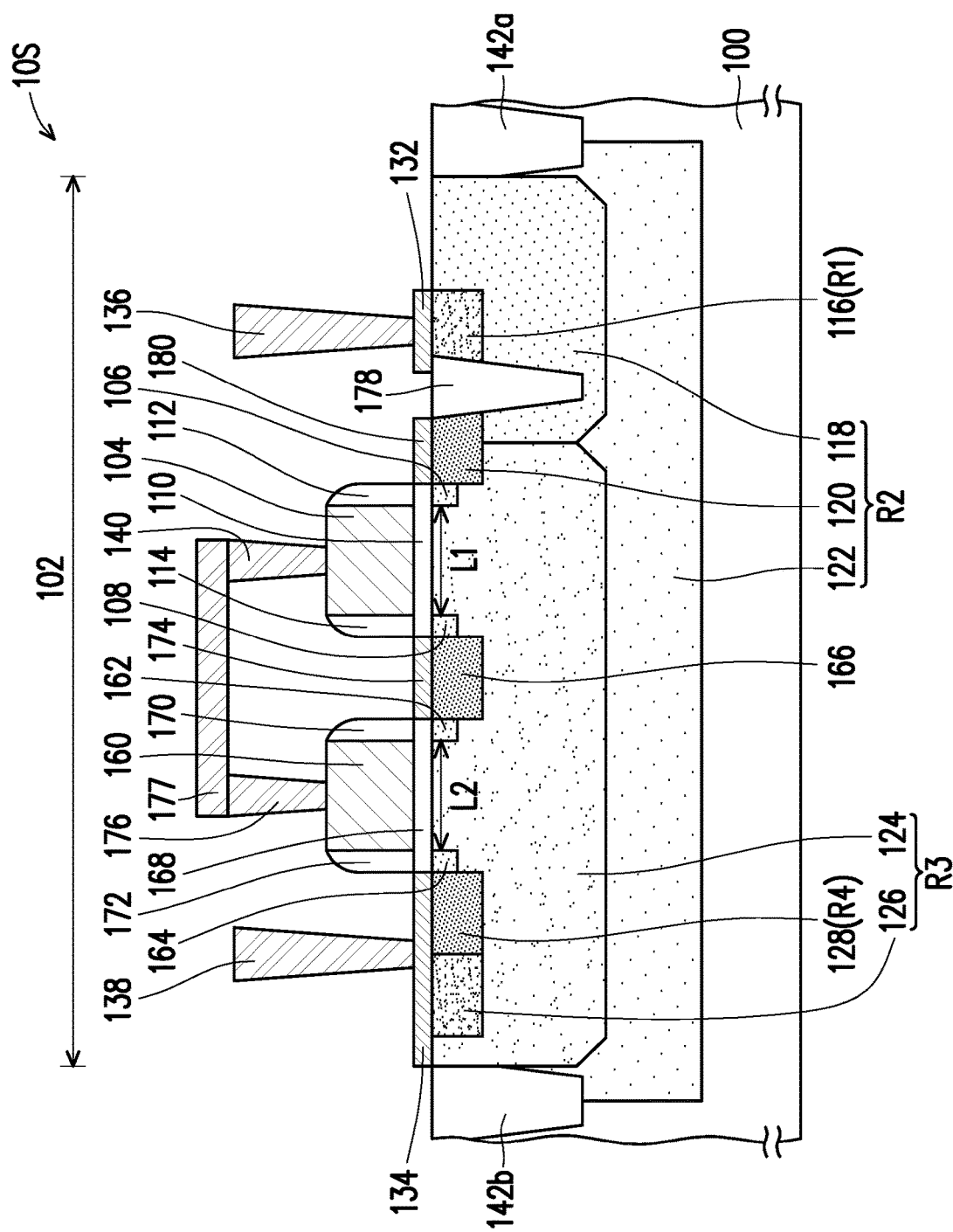

Referring to FIG. 18 and FIG. 19, the difference between the IGBT structure 10S of FIG. 19 and the IGBT structure 10R of FIG. 18 is as follows. In FIG. 19, the IGBT structure 10S does not include the SAB layer 130 in FIG. 18. Furthermore, the IGBT structure 10S may further include an isolation structure 178. The isolation structure 178 is located in the substrate 100 between the doped region 116 and the doped region 120 to isolate the doped region 116 from the doped region 120. The isolation structure 178 is, for example, a STI structure. The material of the isolation structure 178 is, for example, silicon oxide. Moreover, the IGBT structure 10S may further include a metal silicide layer 180. The metal silicide layer 180 is located on the doped region 120. The material of the metal silicide layer 180 is, for example, cobalt silicide or nickel silicide. In addition, the same components in the IGBT structure 10S and the IGBT structure 10R are denoted by the same symbols, and the description thereof is omitted here.

Figure 20:
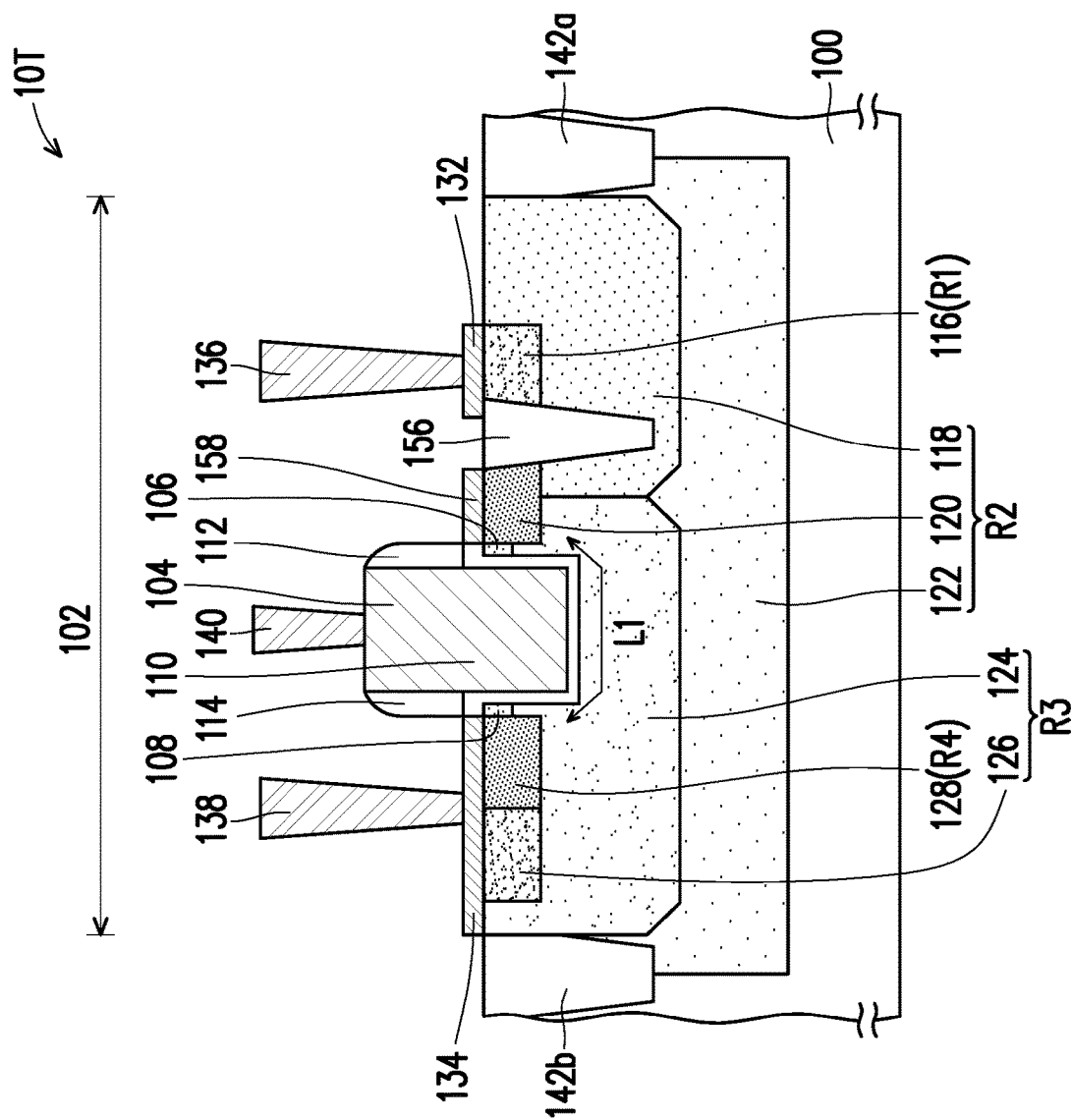

Referring to FIG. 17 and FIG. 20, the difference between the IGBT structure 10T of FIG. 20 and the IGBT structure 10Q of FIG. 17 is as follows. In FIG. 20, the gate 104 of the IGBT structure 10T is a recessed gate, thereby effectively increasing the channel length L1 of the IGBT structure 10T. In addition, the same components in the IGBT structure 10T and the IGBT structure 10Q are denoted by the same symbols, and the description thereof is omitted here.

Figure 21:
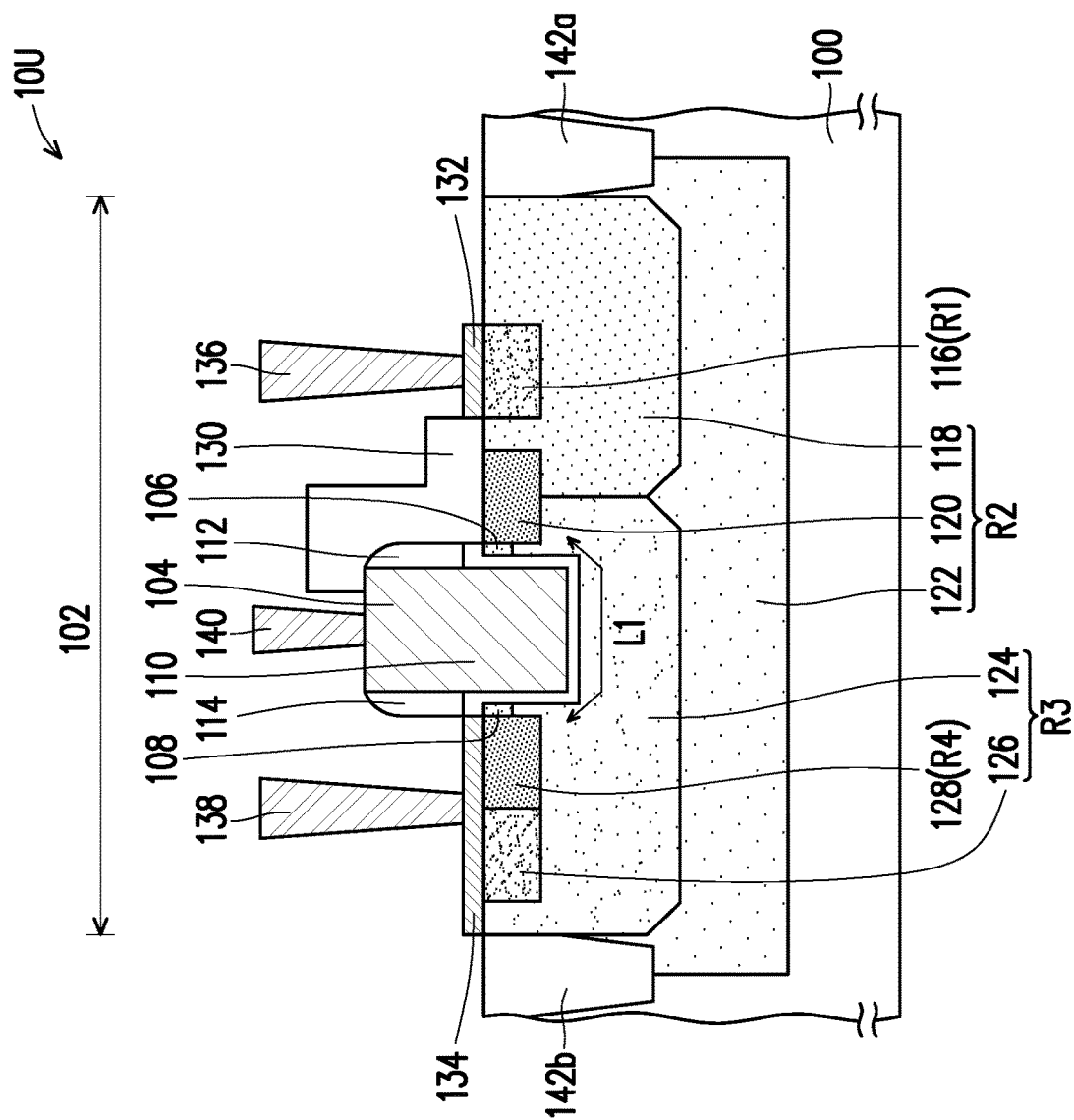

Referring to FIG. 16 and FIG. 21, the difference between the IGBT structure 10U of FIG. 21 and the IGBT structure 10P of FIG. 16 is as follows. In FIG. 21, the gate 104 of the IGBT structure 10U is a recessed gate, thereby effectively increasing the channel length L1 of the IGBT structure 10U. In addition, the same components in the IGBT structure 10U and the IGBT structure 10P are denoted by the same symbols, and the description thereof is omitted here.

In summary, in the IGBT structure and the manufacturing method thereof in the aforementioned embodiments, the gated PNPN diode includes the gate and the SDE regions, and the SDE regions are located in the substrate on two sides of the gate. Since the IGBT structure can be manufactured by using the manufacturing method of the MOS device, the manufacturing process of the IGBT structure can be integrated with the manufacturing process of the MOS device, so that the process complexity can be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An insulated gate bipolar transistor (IGBT) structure, comprising:
   a substrate; and
   a first gated PNPN diode located on the substrate, wherein the first gated PNPN diode comprises:
      a first gate located on the substrate;
      a first source/drain extension (SDE) region and a second SDE region located in the substrate on two sides of the first gate; and
      a first region, a second region, a third region, and a fourth region located in the substrate, wherein the first region and the third region are a first conductive type, the second region, the fourth region, the first SDE region, and the second SDE region are a second conductive type, and there are PN junctions between the first region and the second region, between the second region and the third region, and between the third region and the fourth region, respectively, wherein
      the first region comprises a first doped region,
      the second region comprises a first well region,
      the third region comprises a second well region and a second doped region,
      the fourth region comprises a third doped region,
      the first doped region is located in the first well region,
      the second doped region and the third doped region are located in the second well region, and
      the second doped region is short-circuited with the third doped region, wherein the second region further comprises:
         a fourth doped region located in the first well region, wherein the first well region covers the first doped region and the fourth doped region.

2. The IGBT structure according to claim 1, wherein the first gated PNPN diode further comprises:
   a first dielectric layer located between the first gate and the substrate; and
   a first spacer and a second spacer located on two sidewalls of the first gate, wherein the first SDE region and the second SDE region are respectively located below the first spacer and the second spacer.

3. The IGBT structure according to claim 1, wherein the PN junction between the second region and the third region is located directly under the first gate or located on one side of the first gate.

4. The IGBT structure according to claim 1, wherein the fourth doped region is further located in the second well region.

5. The IGBT structure according to claim 1, further comprising:
   an isolation structure located in the substrate between the first doped region and the fourth doped region.

6. The IGBT structure according to claim 1, wherein the first gated PNPN diode further comprises:

a second gate located on the substrate, wherein the first gate and the second gate are spaced apart above the second well region;

a third SDE region and a fourth SDE region located in the second well region on two sides of the second gate, and the third SDE region and the fourth SDE region are the second conductive type; and a fifth doped region located in the second well region between the first gate and the second gate, wherein the fifth doped region is the second conductive type.

7. The IGBT structure according to claim 6, wherein the first gated PNPN diode further comprises:

a second dielectric layer located between the second gate and the substrate; and a third spacer and a fourth spacer located on two sidewalls of the second gate, wherein the third SDE region and the fourth SDE region are respectively located below the third spacer and the fourth spacer.

8. The IGBT structure according to claim 1, further comprising:

a salicide block layer located on the substrate between the first doped region and the first gate.

9. The IGBT structure according to claim 1, wherein a height of a bottom surface of the first well region is equal to or lower than a height of a bottom surface of the second well region.

10. The IGBT structure according to claim 1, wherein the second region further comprises:

a third well region covering the first well region.

11. The IGBT structure according to claim 10, wherein the third well region further covers the second well region.

12. An IGBT structure, comprising:

a substrate;

a first gated PNPN diode located on the substrate, wherein the first gated PNPN diode comprises:

a first gate located on the substrate;

a first source/drain extension (SDE) region and a second SDE region located in the substrate on two sides of the first gate; and a first region, a second region, a third region, and a fourth region located in the substrate, wherein the first region and the third region are a first conductive type, the second region, the fourth region, the first SDE region, and the second SDE region are a second conductive type, and there are PN junctions between the first region and the second region, between the second region and the third region, and between the third region and the fourth region, respectively, wherein the first region comprises a first doped region, the second region comprises a first well region, the third region comprises a second well region and a second doped region, the fourth region comprises a third doped region, the first doped region is located in the first well region, the second doped region and the third doped region are located in the second well region, and the second doped region is short-circuited with the third doped region, wherein the second region further comprises:

a third well region covering the first well region and the second well region; and a second gated PNPN diode located on the substrate, wherein the first gated PNPN diode and the second gated PNPN diode are mirror-symmetric and share the first gate.

13. The IGBT structure according to claim 12, wherein the second region further comprises:

a fourth well region located between the second well region of the first gated PNPN diode and the second well region of the second gated PNPN diode, wherein the fourth well region is connected to the third well region.

14. The IGBT structure according to claim 1, wherein the second region further comprises:

a third well region partially covering the first well region and completely covering the second well region.

15. The IGBT structure according to claim 1, further comprising:

a third well region located in the substrate, wherein the third well region is the first conductive type, and the third well region covers the first well region.

16. The IGBT structure according to claim 1, wherein a width of a portion of the first gate located above the first well region is greater than a width of a portion of the first gate located above the second well region.

17. The IGBT structure according to claim 1, wherein the first gate has a flat lower surface.

18. An IGBT structure, comprising:

a substrate; and a first gated PNPN diode located on the substrate, wherein the first gated PNPN diode comprises:

a first gate located on the substrate;

a first source/drain extension (SDE) region and a second SDE region located in the substrate on two sides of the first gate; and a first region, a second region, a third region, and a fourth region located in the substrate, wherein the first region and the third region are a first conductive type, the second region, the fourth region, the first SDE region, and the second SDE region are a second conductive type, and there are PN junctions between the first region and the second region, between the second region and the third region, and between the third region and the fourth region, respectively, wherein the substrate is the first conductive type, the first region comprises a first doped region, the second region comprises a first well region, the third region comprises the substrate and a second doped region, the fourth region comprises a third doped region, the first doped region is located in the first well region, the second doped region and the third doped region are located in the substrate, and the second doped region and the third doped region are short-circuited, wherein the second region further comprises:

a fourth doped region located in the first well region, wherein the first well region covers the first doped region and the fourth doped region.

19. The IGBT structure according to claim 1, wherein the first gate comprises a planar gate or a recessed gate.

20. A method of manufacturing an IGBT structure according to claim 1, comprising:

using a manufacturing method of a metal oxide semiconductor device to manufacture an IGBT structure.

* * * * *